(12) United States Patent
VanWyk et al.

(10) Patent No.: US 12,531,567 B1
(45) Date of Patent: Jan. 20, 2026

(54) APPARATUS, SYSTEM, AND METHOD FOR MITIGATING PREDICTABLE INTERFERENCE IN ANALOG SIGNALS VIA DESTRUCTIVE SUMMATION

(71) Applicant: Meta Platforms Technologies, LLC, Menlo Park, CA (US)

(72) Inventors: Eric VanWyk, Seattle, WA (US); Matthew Sherwood, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 162 days.

(21) Appl. No.: 18/351,323

(22) Filed: Jul. 12, 2023

Related U.S. Application Data

(60) Provisional application No. 63/404,969, filed on Sep. 9, 2022.

(51) Int. Cl.
*H03M 1/30* (2006.01)
*H03M 1/06* (2006.01)
*H03M 1/18* (2006.01)

(52) U.S. Cl.
CPC ......... *H03M 1/0626* (2013.01); *H03M 1/181* (2013.01)

(58) Field of Classification Search
CPC ........ H03M 1/12; H03M 3/458; H03M 3/422; H03M 3/464; H03M 1/0626; H03M 1/68; H03M 3/424; H03M 3/46; H03M 1/0673; H03M 1/1004; H03M 1/1009; H03M 1/1033; H03M 1/1245; H03M 1/18; H03M 1/361; H03M 1/38; H03M 1/56; H03M 1/742; H03M 3/32; H03M 3/338; H03M 3/344; H03M 3/368; H03M 3/37; H03M 3/414; H03M 3/426; H03M 3/462; H03M 3/476; H03M 3/50; H03M 7/70; H03M 1/00; H03M 1/001; H03M 1/002; H03M 1/06; H03M 1/0604; H03M 1/0607; H03M 1/0609; H03M 1/0617; H03M 1/0631; H03M 1/0636; H03M 1/066; H03M 1/0675; H03M 1/10; H03M 1/1023; H03M 1/1042; H03M 1/1047; H03M 1/1052; H03M 1/1215; H03M 1/123; H03M 1/1235; H03M 1/124; H03M 1/1295; H03M 1/144; H03M 1/162; H03M 1/181; H03M 1/188;
(Continued)

(56) References Cited

U.S. PATENT DOCUMENTS

| | | | |
|---|---|---|---|
| 10,135,459 B2 * | 11/2018 | Sharma | A61B 5/7203 |
| 11,101,810 B1 * | 8/2021 | Veldhoven | H03M 1/1009 |
| 2005/0275576 A1 * | 12/2005 | Fudge | H03M 1/0626 341/155 |
| 2016/0094236 A1 * | 3/2016 | Shionoiri | H03M 1/002 341/122 |

(Continued)

*Primary Examiner* — Linh V Nguyen
(74) *Attorney, Agent, or Firm* — Morgan, Lewis & Bockius LLP

(57) ABSTRACT

A circuit comprising (1) one or more input devices configured to sense analog inputs, (2) at least one analog-to-digital converter communicatively coupled to the input devices and configured to convert the analog inputs into digital inputs, (3) at least one filter component communicatively coupled to the analog-to-digital converter and configured to output digital feedback based at least in part on the digital inputs, and (4) a digital-to-analog converter communicatively coupled to the filter component and configured to (A) convert the digital feedback into analog feedback and (B) output the analog feedback to facilitate removing the analog feedback from the analog inputs. Various other apparatus, systems, and methods are also disclosed.

19 Claims, 13 Drawing Sheets

(58) Field of Classification Search
CPC ........ H03M 1/20; H03M 1/201; H03M 1/206;
H03M 1/34; H03M 1/368; H03M 1/46;
H03M 1/466; H03M 1/468; H03M 1/50;
H03M 1/502; H03M 1/508; H03M 1/66;
H03M 1/662; H03M 1/687; H03M 1/765;
H03M 1/80; H03M 1/808; H03M 3/34;
H03M 3/346; H03M 3/348; H03M 3/352;
H03M 3/354; H03M 3/356; H03M 3/382;
H03M 3/39; H03M 3/392; H03M 3/42;
H03M 3/432; H03M 3/434; H03M 3/436;
H03M 3/438; H03M 3/452; H03M 3/454;
H03M 3/484; H03M 3/494; H03M 7/3059; H03M 7/6005; H03M 7/6052
USPC .................................. 341/143, 155, 118–121
See application file for complete search history.

(56) References Cited

U.S. PATENT DOCUMENTS

| | | | |
|---|---|---|---|
| 2016/0269011 A1* | 9/2016 | Uehara | G01P 15/09 |
| 2017/0276694 A1* | 9/2017 | Uehara | G05F 3/02 |
| 2018/0132750 A1* | 5/2018 | Kalb | H03M 3/414 |
| 2018/0348349 A1* | 12/2018 | Ouzounov | A61B 8/065 |
| 2020/0158770 A1* | 5/2020 | Huynh | H03K 5/24 |
| 2022/0327370 A1* | 10/2022 | Huynh | H03M 3/458 |
| 2022/0357762 A1* | 11/2022 | Seger, Jr. | G06F 3/016 |
| 2022/0401025 A1* | 12/2022 | Bossetti | A61B 5/7475 |
| 2023/0145384 A1* | 5/2023 | Kamran | A61B 5/7225 600/547 |
| 2023/0145547 A1* | 5/2023 | Takeda | G06F 3/011 341/50 |
| 2024/0115202 A1* | 4/2024 | Tran | A61B 5/002 |

* cited by examiner

US 12,531,567 B1

APPARATUS, SYSTEM, AND METHOD FOR MITIGATING PREDICTABLE INTERFERENCE IN ANALOG SIGNALS VIA DESTRUCTIVE SUMMATION

CROSS-REFERENCE TO RELATED APPLICATIONS

This application claims the benefit of priority to U.S. Provisional Application No. 63/404,969, which was filed 9 Sep. 2022. The contents of this provisional application is also incorporated herein by reference in its entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
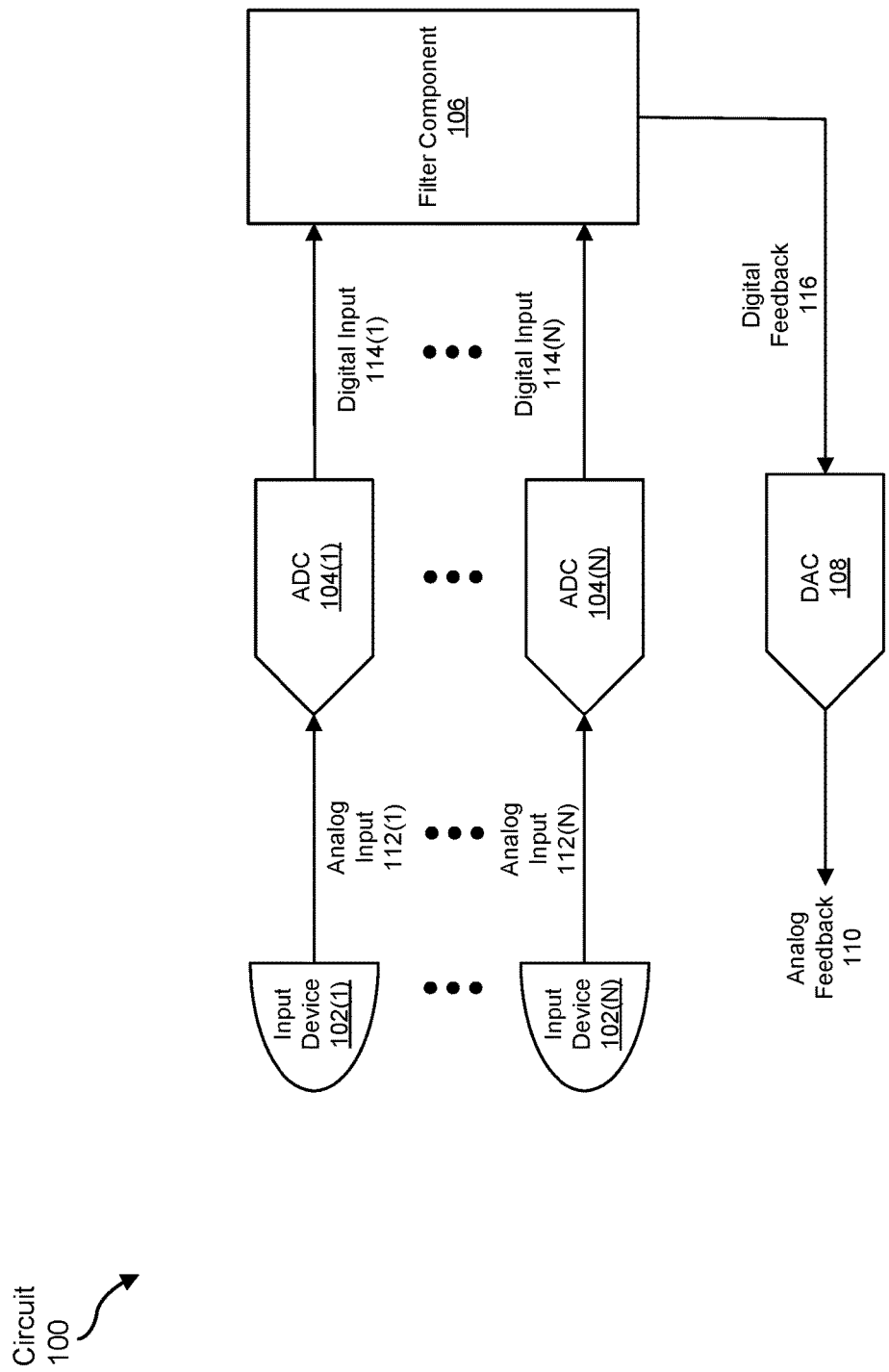
FIG. 1 is a block diagram of an exemplary circuit for mitigating predictable interference in analog signals via destructive summation according to one or more embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to apparatuses, systems, and methods for mitigating, cancelling, and/or reducing predictable interference in analog signals via destructive summation. As will be explained in greater detail below, these apparatuses, systems, and methods may provide numerous features and benefits over traditional technologies.

Human bodies and/or biosensors may be highly susceptible to interference and/or noise from outside sources. For example, a user may don one or more wearable devices that include biosensors for detecting, sensing, and/or measuring neuromuscular signals, such as electromyographic (EMG) signals, via the user's body. In this example, the user's body may serve and/or act as an antenna that captures and/or receives 50-60 hertz (Hz) interference and/or noise from nearby power lines and/or fluorescent lights. Accordingly, the signals detected, sensed, and/or measured by the biosensors may constitute and/or represent a combination of the actual signals of interest and the 50-60 Hz interference and/or noise.

Unfortunately, in some cases, the 50-60 Hz interference and/or noise may constitute and/or represent the vast majority of the magnitude of the signals detected, sensed, and/or measured by the biosensors. In other words, the magnitude of the signals of interest may be much smaller and/or overwhelmed by the magnitude of the 50-60 Hz interference and/or noise.

To isolate and/or analyze the signal of interest despite the interference and/or noise, computing equipment designers and/or manufacturers may apply and/or implement some sort of digital filtering and/or digital signal processing. For example, a biosensor may feed and/or provide a measured signal to an analog-to-digital converter (ADC), which converts the measured signal from the analog domain to the digital domain. In this example, upon completing the analog-to-digital conversion, the ADC may feed and/or provide the measured signal to a processing device that performs digital filtering and/or digital signal processing on the digital representation of the signal measured by the biosensor. The processing device may then attempt to extrapolate, estimate, predict, and/or model the portion of the measured signal that represents the signal of interest and/or the portion of the measured signal that represents the interference and/or noise. Additionally or alternatively, the processing device may subtract and/or remove the modeled interference and/or noise digitally from the measured signal in an attempt to isolate the signal of interest.

Unfortunately, such digital filtering and/or digital signal processing may have certain shortcomings and/or deficiencies. For example, as the magnitude of the interference and/or noise often overwhelms the magnitude of the signals of interest, the input stage of the biosensor circuitry and/or data collection device may need to accommodate wide ranges of analog input signals. In this example, the need to accommodate such wide signal ranges may constitute and/or represent a design constraint that directly reduces and/or impairs the effective resolution of the biosensor circuitry and/or data collection device. Additionally or alternatively, digitally subtracting and/or removing modeled interference from measured signals may result in and/or lead to somewhat unreliable and/or ineffective predictions of the signals of interest.

The instant disclosure, therefore, identifies and addresses a need for additional apparatuses, systems, and methods for mitigating predictable interference in analog signals via destructive summation. Accordingly, these apparatuses, systems, and methods may be able to improve the quality of signal-of-interest measurements by subtracting and/or removing predictable interference in the analog domain instead of the digital domain. For example, a data collection device donned by a user may include and/or represent one or more biosensors that measure EMG signals via the user's body. In one example, the data collection device may generate a synthesized digital representation of the prediction of the interference, convert the synthesized digital representation of the predicted interference to the analog domain, and then destructively sum the analog conversion of the predictive interference with the actual EMG signals to isolate the signals of interest in the analog domain. After isolating the signals of interest in this way, the data collection device may process the signals of interest to glean certain information about the user (e.g., a specific gesture made by the user). Such improved signal-of-interest measurements may result in more accurate detection of certain gestures made by the user and/or reduce the number of false positives and/or negatives.

The following will provide, with reference to FIGS. 1-7, detailed descriptions of various apparatuses, systems, components, and/or implementations capable of mitigating predictable interference in analog signals via destructive summation. The discussion corresponding to FIG. 8 will provide detailed descriptions of an exemplary method for mitigating predictable interference in analog signals via destructive summation. The discussion corresponding to FIGS. 9-13 will provide detailed descriptions of types of exemplary artificial-reality devices, wearables, and/or associated systems that may support and/or contribute to the mitigation of predictable interference in analog signals by using destructive summation.

FIG. 1 illustrates an exemplary circuit 100 capable of mitigating predictable interference in analog signals via destructive summation. In some examples, circuit 100 may include and/or represent circuitry of a data collection device or component. In one example, circuit 100 may include and/or represent all or a portion of a Right Leg Driver (RLD) circuit and/or device. In this example, the RLD circuit and/or device may be able to predict, reduce, and/or cancel common-mode interference introduced into analog inputs 112(1)-(N) by outside sources. Circuit 100 may include and/or represent all or a portion of an integrated circuit and/or an arrangement of certain discrete components or devices.

As illustrated in FIG. 1, exemplary circuit 100 may include and/or represent one or more input devices 102(1)-(N) configured to sense, detect, and/or measure one or more analog inputs 112(1)-(N). In one example, circuit 100 may also include and/or represent one or more ADCs 104(1)-(N) communicatively coupled to input devices 102(1)-(N). In this example, ADCs 104(1)-(N) may be configured to convert and/or transform analog inputs 112(1)-(N) into one or more digital inputs 114(1)-(N).

In some examples, circuit 100 may further include and/or represent a filter component 106 communicatively coupled to ADCs 104(1)-(N). In such examples, filter component 106 may be configured to generate and/or output digital feedback 116 based at least in part on digital representations 114(1)-(N). In one example, digital feedback 116 may include and/or represent a prediction of the interference present in analog inputs 112(1)-(N) based at least in part on digital representations 114(1)-(N). In another example, digital feedback 116 may include and/or represent a prediction of the interference present in only one of analog inputs 112(1)-(N) based at least in part on one of digital representations 114(1)-(N). Accordingly, in certain implementations, circuit 100 may generate and/or output predictions of the interference present in each input independently and/or predictions of the interference present in the inputs together.

In one example, circuit 100 may additionally include and/or represent a digital-to-analog converter (DAC) 108 communicatively coupled to filter component 106. In this example, DAC 108 may be configured to convert and/or transform digital feedback 116 into analog feedback 110. Additionally or alternatively, DAC 108 may be configured to output and/or provide analog feedback 110 to facilitate removing analog feedback 110 from analog inputs 112(1)-(N).

In some examples, analog inputs 112(1)-(N) may each constitute and/or represent a time-varying analog signal and/or electrical response produced by skeletal muscles in a user's body. In one example, analog inputs 112(1)-(N) may include and/or represent neuromuscular signals that traverse and/or travel through the user's body. For example, the user may make a pose and/or gesture that generates neuromuscular signals that traverse down his or her arm toward a hand and/or down his or her leg toward a foot. In this example, input devices 102(1)-(N) may detect, sense, and/or measure such neuromuscular signals. Examples of analog inputs 112(1)-(N) include, without limitation, neuromuscular signals or activity, EMG signals or activity, electrocardiographic (ECG) signals or activity, mechanomyographic (MMG) signals or activity, sonomyography (SMG) signals or activity, audio signals or activity, combinations or variations of one or more of the same, and/or any other suitable neuromuscular signals.

In some examples, input devices 102(1)-(N) may include and/or represent any type or form of component and/or mechanism capable of detecting, sensing, and/or measuring analog inputs 112(1)-(N). In one example, input devices 102(1)-(N) may include and/or represent electrodes that physically and/or electrically couple or attach to the skin of the user. Additional examples of input devices 102(1)-(N) include, without limitation, microphones, hydrophones, EMG sensors, ECG sensors, MMG sensors, SMG sensors, vibration sensors, pressure sensors, displacement sensors, eddy current sensors, velocity sensor, accelerometers, gyroscopes, transducers, combinations or variations of one or more of the same, and/or any other suitable types of input devices.

In some examples, filter component 106 may include and/or represent any type or form of device, feature, system, and/or mechanism capable of combining and/or processing digital signals into digital feedback. In such examples, filter component 106 may analyze and/or process digital inputs 114(1)-(N) as hints, clues, evidence, and/or predictors of the amount of interference or noise present and/or expected in analog inputs 112(1)-(N). Additionally or alternatively, filter component 106 may use digital inputs 114(1)-(N) to predict, estimate, and/or forecast the amount of interference or noise present and/or expected in analog inputs 112(1)-(N) at a future moment in time.

In one example, filter component 106 may include and/or represent a filterbank (e.g., an array of bandpass filters) configured to combine and/or process digital inputs 114(1)-(N) to produce and/or render digital feedback 116. In another example, filter component 106 may include and/or represent a machine learning model and/or artificial intelligence configured to run on a processing device. In this example, the machine learning model and/or artificial intelligence may be configured to combine and/or process digital inputs 114(1)-(N) to generate and/or produce digital feedback 116.

In some examples, digital feedback 116 may constitute and/or represent a computation, calculation, and/or prediction of the amount of interference and/or noise present in analog inputs 112(1)-(N) now or at a future moment in time. In such examples, digital feedback 116 may include and/or represent a digital signal and/or data indicative, representative, and/or predictive of the amount of interference and/or noise present in analog inputs 112(1)-(N). In one example, digital feedback 116 may be converted and/or transformed into analog feedback 110, which is then destructively summed with analog inputs 112(1)-(N). The destructive summation of analog feedback 110 and analog inputs 112(1)-(N) may result in and/or render analog signals that exclude and/or omit the predicted interference and/or noise. In other words, the destructive summation of analog feedback 110 and analog inputs 112(1)-(N) may effectively mitigate, reduce, and/or remove the predictable interference and/or noise, thereby rendering and/or revealing the corresponding signals of interest.

In some examples, ADCs 104(1)-(N) may each include and/or represent any type or form of device, component, and/or system that converts or transforms an analog signal into a digital signal. Examples of ADCs 104(1)-(N) include, without limitation, differential ADCs, successive approximation ADCs, delta-sigma ADCs, dual slope ADCs, pipelined ADCs, flash ADCs, direct-conversion ADCs, ramp-compare ADCs, combinations or variations of one or more of the same, and/or any other suitable ADCs.

In some examples, DAC 108 may include and/or represent any type or form of device, component, and/or system that converts or transforms a digital signal into an analog signal. Examples of DAC 108 include, without limitation, binary-weighted DACs, switch resistor DACs, binary ladder DACs, successive approximation DACs, hybrid DACs, delta-sigma DACs, segmented DACs, combinations or variations of one or more of the same, and/or any other suitable DACs.

Circuit 100 in FIG. 1 may be implemented in a variety of ways. Accordingly, circuit 100 in FIG. 1 may take on and/or assume various forms and/or configurations consistent with and/or variant to the above descriptions. For example, all or a portion of exemplary circuit 100 may constitute and/or represent all or portions of exemplary apparatuses 200, 300, 400, or 500 in FIG. 2, 3, 4, or 5, respectively. In addition, although various components and/or elements of circuit 100 and/or apparatuses 200, 300, 400, or 500 are illustrated as discrete features, one or more of those components and/or elements may alternatively be combined and/or consolidated into a single unit and/or device. For example, a processing device may include and/or represent one or more built-in ADCs, an integrated filterbank, and/or a DAC.

Figure 2:
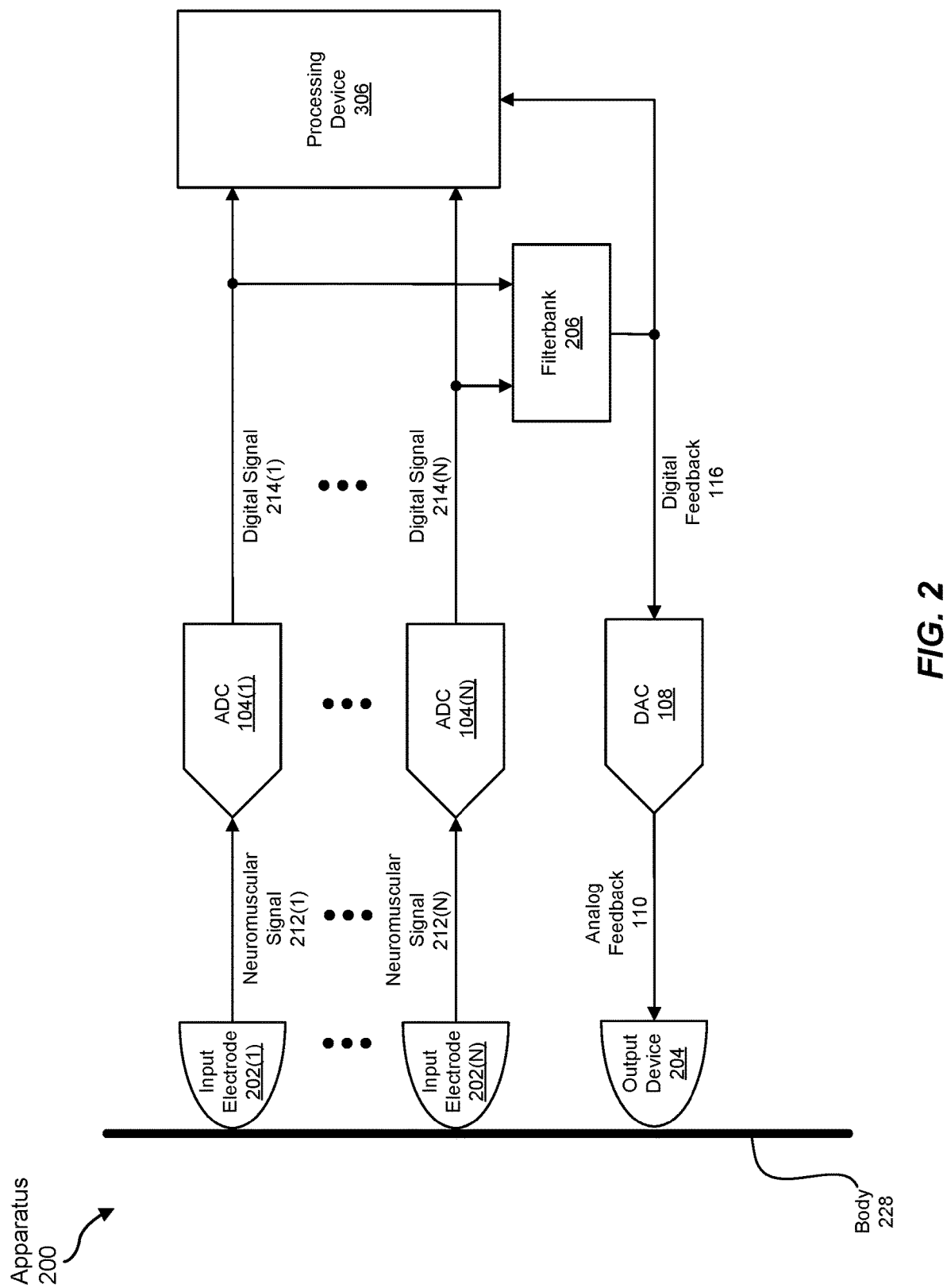
FIG. 2 is a block diagram of an exemplary apparatus for mitigating predictable interference in analog signals via destructive summation according to one or more embodiments of this disclosure.

FIG. 2 illustrates an exemplary apparatus 200 capable of mitigating predictable interference in analog signals via destructive summation. In some examples, apparatus 200 may include and/or represent certain devices, components, and/or features that perform and/or provide similar or identical functionalities as described above in connection with circuit 100 in FIG. 1. As illustrated in FIG. 2, exemplary apparatus 200 may include and/or represent one or more input electrodes 202(1)-(N) configured to sense, detect, and/or measure one or more neuromuscular signals 212(1)-(N). In one example, apparatus 200 may also include and/or represent ADCs 104(1)-(N) communicatively coupled to input electrodes 202(1)-(N). In this example, ADCs 104(1)-(N) may be configured to convert and/or transform neuromuscular signals 212(1)-(N) into one or more digital signals 214(1)-(N). In certain implementations, neuromuscular signals 212(1)-(N) may include and/or represent EMG or ECG signals detected via a body 228 of a user.

In some examples, apparatus 200 may further include and/or represent a filterbank 206 communicatively coupled to ADCs 104(1)-(N). In such examples, filterbank 206 may include and/or represent an array of filters configured to generate and/or output digital feedback 116 based at least in part on digital signals 214(1)-(N). In one example, apparatus 200 may additionally include and/or represent DAC 108 communicatively coupled between filterbank 206 and an output device 204. In this example, DAC 108 may be configured to convert and/or transform digital feedback 116 into analog feedback 110. Additionally or alternatively, DAC 108 may be configured to output and/or provide analog feedback 110 to output device 204. In one implementation, output device 204 may be configured to communicatively couple DAC 108 to body 228 of the user.

In some examples, output device 204 may include and/or represent any type or form of component and/or mechanism capable of injecting, integrating, and/or feeding analog feedback 110 into body 228 of the user. In one example, output device 204 may include and/or represent an output electrode that physically and/or electrically couples or attaches to the skin of the user. Additional examples of output device 204 include, without limitation, speakers, diffusers, vibrators, actuators, transducers, electrodes, combinations or variations of one or more of the same, and/or any other suitable types of output devices.

In some examples, apparatus 200 may also include and/or represent a processing device 306 communicatively coupled to ADCs 104(1)-(N) and filterbank 206. In such examples, processing device 306 may receive and/or obtain digital signals 214(1)-(N) and/or digital feedback 216 from ADCs 104(1)-(N) and filterbank 206, respectively. In one example, processing device 306 may analyze and/or process digital signals 214(1)-(N) and/or digital feedback 216. In this example, processing device 306 may then isolate and/or identify a predictive signal of interest based at least in part on the analysis and/or processing of digital signals 214(1)-(N) and/or digital feedback 216.

In some examples, processing device 306 may determine and/or detect certain gestures, motions, and/or actions performed by the user based at least in part on the analysis and/or processing of digital signals 214(1)-(N) and/or digital feedback 216. In such examples, processing device 306 may generate and/or produce a command and/or instruction based at least in part on and/or in response to the predictive signal of interest and/or one or more gestures, motions, and/or actions performed by the user. In one example, the command and/or instruction may cause and/or direct a computing device (not necessarily illustrated in FIG. 2) to modify at least one feature to account for the predictive signal of interest and/or one or more gestures, motions, and/or actions performed by the user. In this example, the feature being modified may include and/or represent any attribute, characteristic, quality, component, and/or element of application running on the computing device.

In some examples, processing device 306 may include and/or represent any type or form of hardware-implemented processing unit and/or component capable of interpreting and/or executing computer-readable instructions. In one example, processing device 306 may access, execute, and/or modify certain software modules to facilitate and/or support mitigating predictable interference in analog signals via destructive summation. Examples of processing device 306 include, without limitation, physical processors, Central Processing Units (CPUs), microprocessors, microcontrollers, Field-Programmable Gate Arrays (FPGAs) that implement softcore processors, Application-Specific Integrated Circuits (ASICs), Systems on a Chip (SoCs), integrated circuits, portions of one or more of the same, variations or combinations of one or more of the same, and/or any other suitable processing device.

In some examples, depending on the configuration of circuitry in apparatus 200, digital feedback 116 and/or analog feedback 110 may be inverted at one stage or another to facilitate the subtraction and/or removal of the predictable interference from neuromuscular signals 212(1)-(N). This inversion of digital feedback 116 and/or analog feedback 110 may occur and/or take place at various stages within the circuitry of apparatus 200. For example, filterbank 206 may be configured to invert digital feedback 116 relative to digital signals 214(1)-(N) prior to reaching DAC 108 and/or processing device 306. In another example, DAC 108 may include and/or represent a negative gain buffer configured to invert digital feedback 116 relative to digital signals 214(1)-(N). Additionally or alternatively, DAC 108 may be configured to invert analog feedback 110 relative to digital feedback 116.

In some examples, output device 204 may be configured to inject, diffuse, feed, and/or provide analog feedback 110 to body 228 of the user. In one example, body 228 of the user may effectively serve and/or function to destructively sum neuromuscular signals 212(1)-(N) with analog feedback 110 and/or perform destructive interference on neuromuscular signals 212(1)-(N) with analog feedback 110. In certain implementations, the terms "destructive summation" and/or "destructive interference" may refer to and/or represent the process of displacing and/or compensating at least a portion of one analog wave or signal via another analog wave or signal. In such implementations, the amplitude of the resulting analog wave or signal may constitute and/or represent a differential and/or delta of those analog waves or signals.

Figure 3:
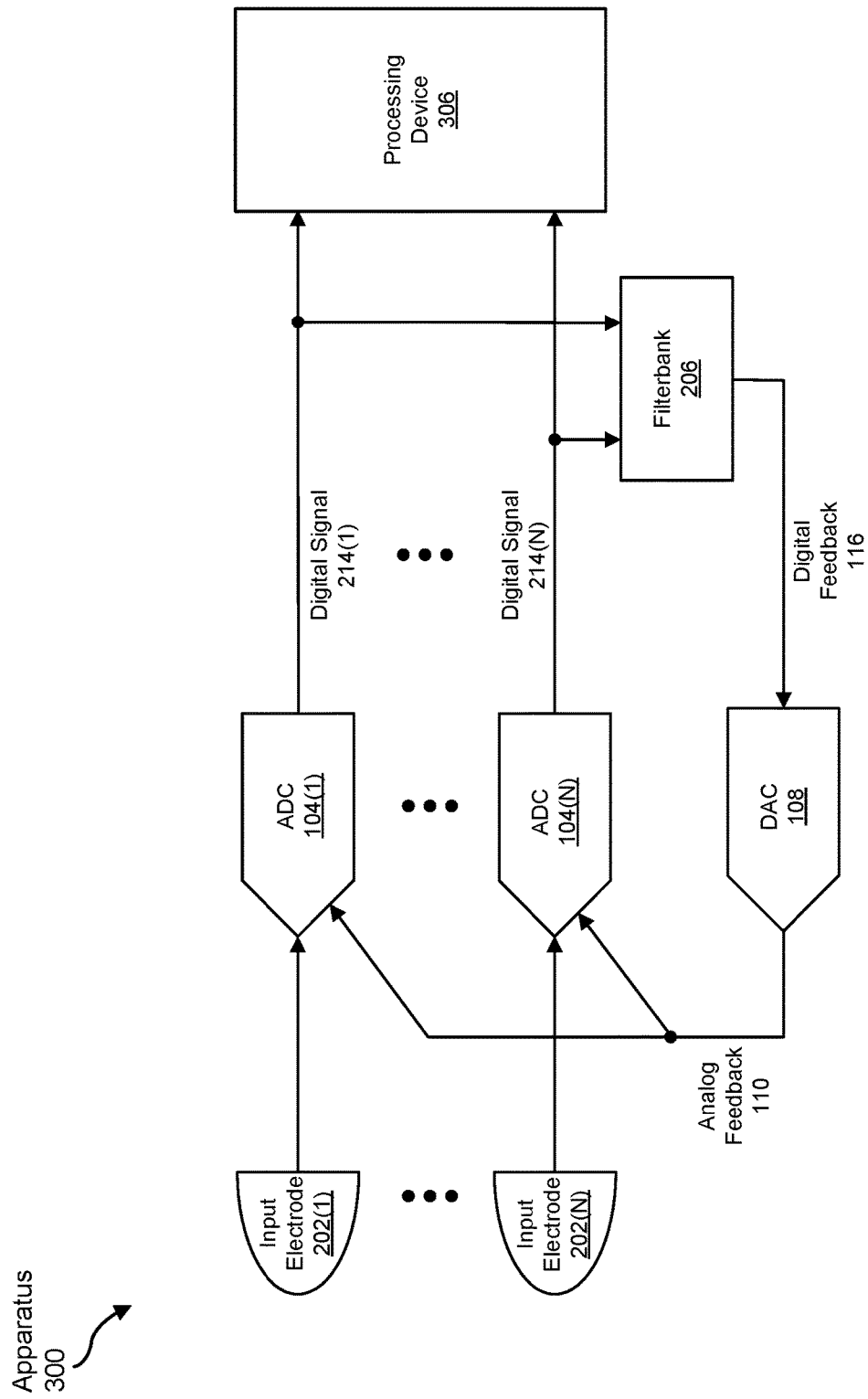
FIG. 3 is a block diagram of an exemplary apparatus for mitigating predictable interference in analog signals via destructive summation according to one or more embodiments of this disclosure.

FIG. 3 illustrates an exemplary apparatus 300 capable of mitigating predictable interference in analog signals via destructive summation. In some examples, apparatus 300 may include and/or represent certain devices, components, and/or features that perform and/or provide similar or identical functionalities as described above in connection with circuit 100 in FIG. 1 and/or apparatus 200 in FIG. 2. As illustrated in FIG. 3, exemplary apparatus 300 may include and/or represent input electrodes 202(1)-(N) that sense, detect, and/or measure neuromuscular signals 212(1)-(N). In one example, apparatus 300 may also include and/or represent ADCs 104(1)-(N) communicatively coupled to input electrodes 202(1)-(N). In this example, ADCs 104(1)-(N) may convert and/or transform neuromuscular signals 212(1)-(N) into one or more digital signals 214(1)-(N).

In some examples, apparatus 300 may further include and/or represent filterbank 206 communicatively coupled to ADCs 104(1)-(N). In such examples, filterbank 206 may generate and/or output digital feedback 116 based at least in part on digital signals 214(1)-(N). In one example, apparatus 300 may additionally include and/or represent DAC 108 communicatively coupled between filterbank 206 and ADCs 104(1)-(N). In this example, DAC 108 may convert and/or transform digital feedback 116 into analog feedback 110. Additionally or alternatively, DAC 108 may output and/or provide analog feedback 110 to ADCs 104(1)-(N).

In some examples, one or more of ADCs 104(1)-(N) may include and/or represent a differential ADC with a positive input and a negative input. For example, ADCs 104(1)-(N) may each include and/or represent differential inputs. In this example, a positive input of ADC 104(1) may be configured to receive and/or obtain neuromuscular signal 212(1), and a negative input of ADC 104(1) may be configured to receive and/or obtain analog feedback 110. Additionally or alternatively, ADC 104(1) may be configured to destructively sum analog feedback 110 with neuromuscular signal 212(1) prior to neuromuscular signal 212(1) being converted into digital signal 214(1). By doing so, ADC 104(1) may enable apparatus 300 to perform destructive interference on neuromuscular signal 212(1) and analog feedback 110 in the analog domain.

Continuing with this example, a positive input of ADC 104(N) may be configured to receive and/or obtain neuromuscular signal 212(N), and a negative input of ADC 104(N) may be configured to receive and/or obtain analog feedback 110. Additionally or alternatively, ADC 104(N) may be configured to destructively sum analog feedback 110 with neuromuscular signal 212(N) prior to neuromuscular signal 212(N) being converted into digital signal 214(N). By doing so, ADC 104(N) may enable apparatus 300 to perform destructive interference on neuromuscular signal 212(N) and analog feedback 110 in the analog domain.

Figure 4:
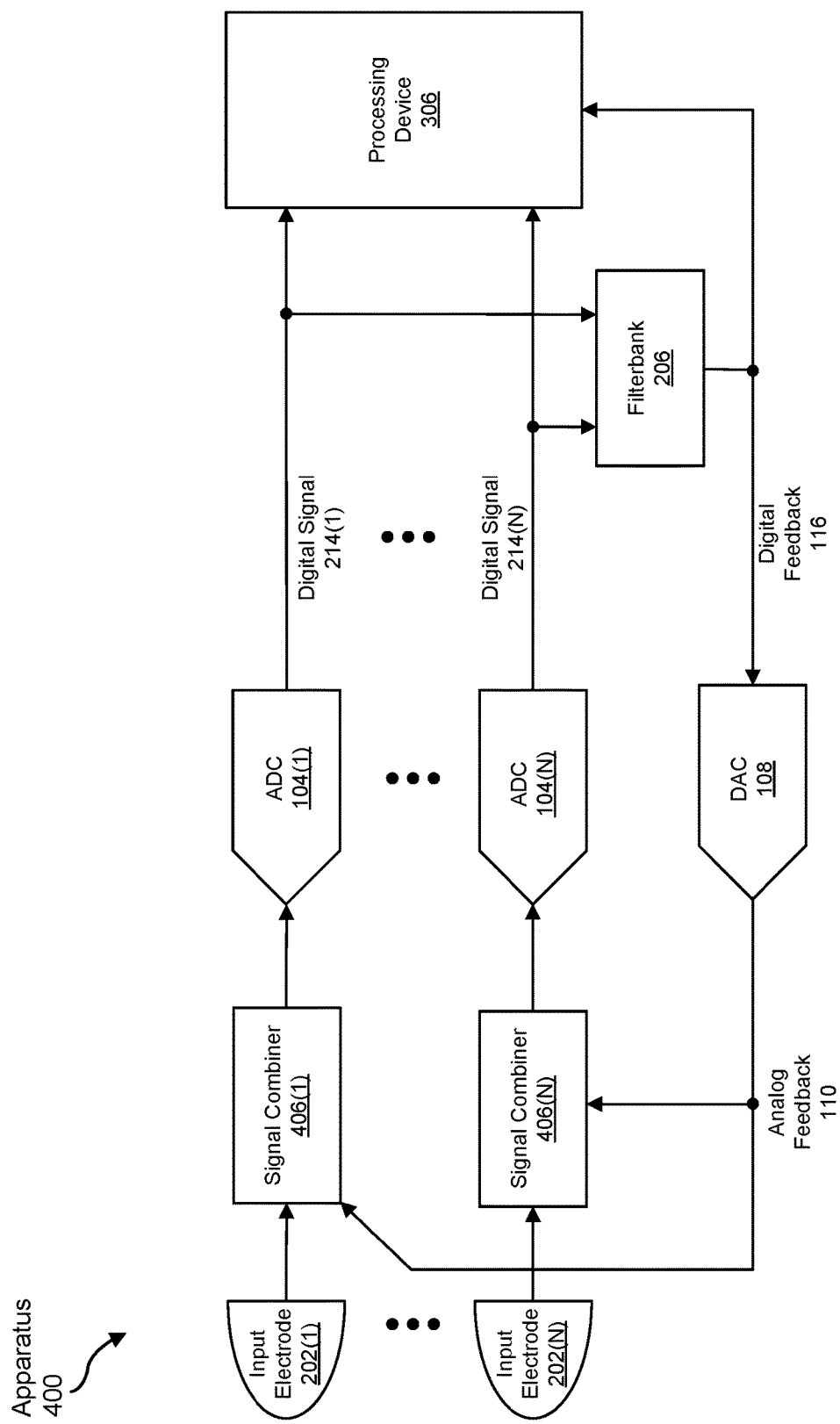
FIG. 4 is a block diagram of an exemplary apparatus for mitigating predictable interference in analog signals via destructive summation according to one or more embodiments of this disclosure.

FIG. 4 illustrates an exemplary apparatus 400 capable of mitigating predictable interference in analog signals via destructive summation. In some examples, apparatus 400 may include and/or represent certain devices, components, and/or features that perform and/or provide similar or identical functionalities as described above in connection with circuit 100 in FIG. 1, apparatus 200 in FIG. 2, and/or apparatus 300 in FIG. 3. As illustrated in FIG. 4, exemplary apparatus 400 may include and/or represent input electrodes 202(1)-(N) that sense, detect, and/or measure neuromuscular signals 212(1)-(N). In one example, apparatus 400 may also include and/or represent one or more signal combiners 406(1)-(N) communicatively coupled between input electrodes 202(1)-(N) and ADCs 104(1)-(N).

In some examples, signal combiner 406(1) may include an input configured to receive and/or obtain neuromuscular signal 212(1) from input electrode 202(1) and another input configured to receive and/or obtain analog feedback 110 from DAC 108. In one example, signal combiner 406(1) may be configured to destructively sum neuromuscular signal 212(1) and analog feedback 110 prior to neuromuscular signal 212(1) being converted into digital signal 214(1). In other words, signal combiner 406(1) may displace and/or compensate neuromuscular signal 212(1) by analog feedback 110 prior to neuromuscular signal 212(1) being converted into digital signal 214(1).

Additionally or alternatively, signal combiner 406(N) may include an input configured to receive and/or obtain neuromuscular signal 212(N) from input electrode 202(N) and another input configured to receive and/or obtain analog feedback 110 from DAC 108. In one example, signal combiner 406(N) may be configured to destructively sum neuromuscular signal 212(N) and analog feedback 110 prior to neuromuscular signal 212(N) being converted into digital signal 214(N). In other words, signal combiner 406(N) may displace and/or compensate neuromuscular signal 212(N) by analog feedback 110 prior to neuromuscular signal 212(N) being converted into digital signal 214(N).

In some examples, signal combiners 406(1)-(N) may each include and/or represent any type or form of circuitry and/or component configuration that facilitates combining analog signals with one another. In one example, one or more of signal combiners 406(1)-(N) may constitute and/or represent a differential amplifier that facilitates destructively summing a neuromuscular signal with analog feedback 110. Additionally or alternatively, depending on the configuration of circuitry in apparatus 400 (e.g., if analog feedback 110 has been inverted), one or more of signal combiners 406(1)-(N) may constitute and/or represent a summing amplifier that facilitates destructively summing a neuromuscular signal with analog feedback 110.

Figure 7:
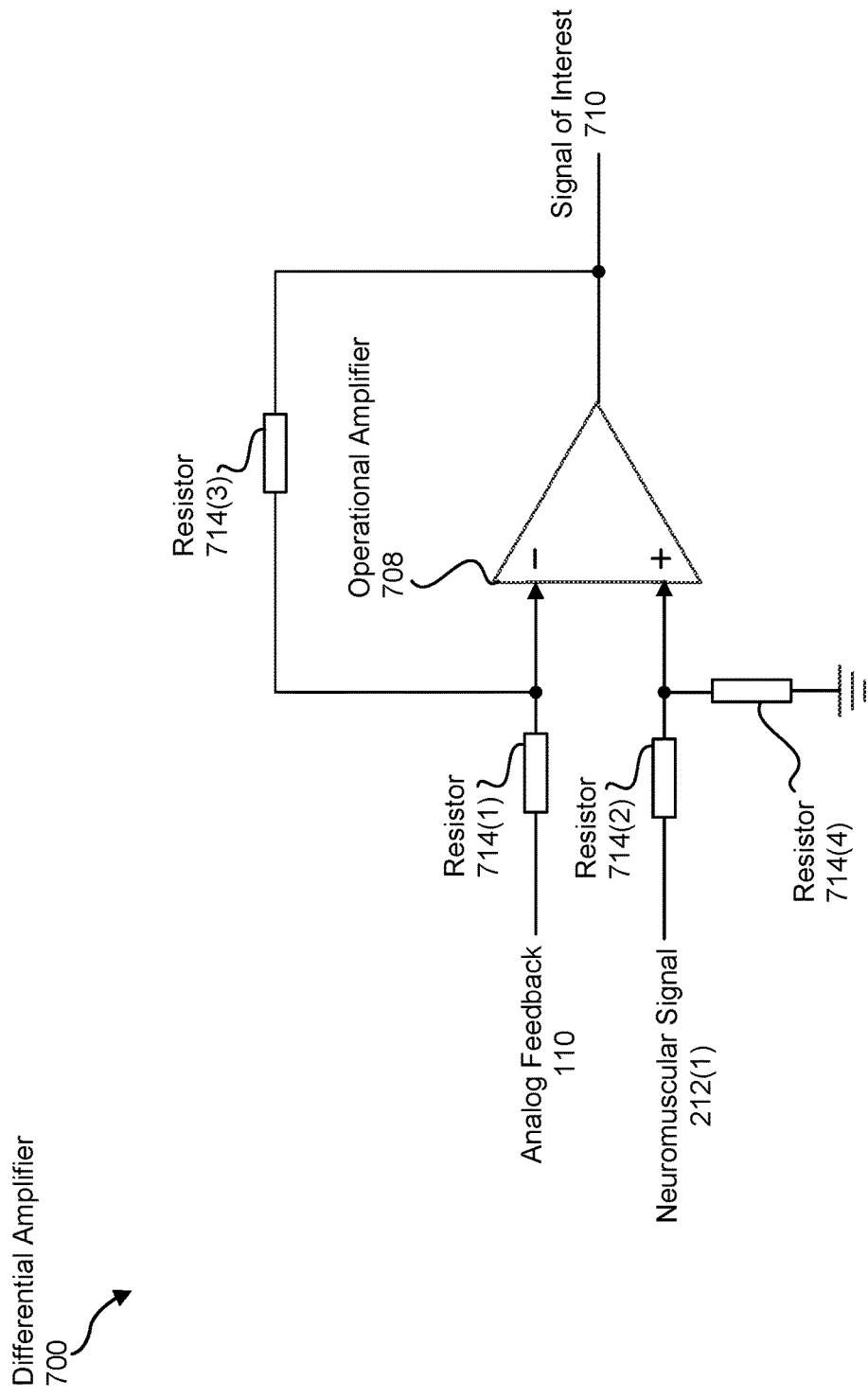
FIG. 7 is a circuit diagram of an exemplary differential amplifier for mitigating predictable interference in analog signals via destructive summation according to one or more embodiments of this disclosure.

FIG. 7 illustrates an exemplary differential amplifier 700 capable of destructively summing neuromuscular signal 212(1) and analog feedback 110. As illustrated in FIG. 7, exemplary differential amplifier 700 may include and/or represent an operational amplifier 708 whose negative input is electrically coupled to analog feedback 110 via a resistor 714(1) and whose positive input is electrically coupled to neuromuscular signal 212(1) via a resistor 714(2). In some examples, differential amplifier 700 may also include and/or represent a resistor 714(3) electrically coupled between the negative input of operational amplifier 708 and the output of operational amplifier 708. In such examples, this path between the negative input and the output may constitute and/or establish a negative feedback connection for differential amplifier 700.

In some examples, differential amplifier 700 may further include and/or represent a resistor 714(4) electrically coupled between the positive input of operational amplifier 708 and ground. In one example, differential amplifier 700 may destructively sum and/or perform destructive interference on neuromuscular signal 212(1) and analog feedback 110 to render a signal of interest 710. In this example, signal of interest 710 may constitute and/or represent an analog differential and/or delta of neuromuscular signal 212(1) and analog feedback 110. In other words, signal of interest 710 may exclude and/or omit the predictable interference and/or noise expected to have existed in neuromuscular signal 212(1) at that moment in time. In certain implementations, signal of interest 710 may be fed and/or provided to ADC 104(1) for conversion to the digital domain.

Figure 5:
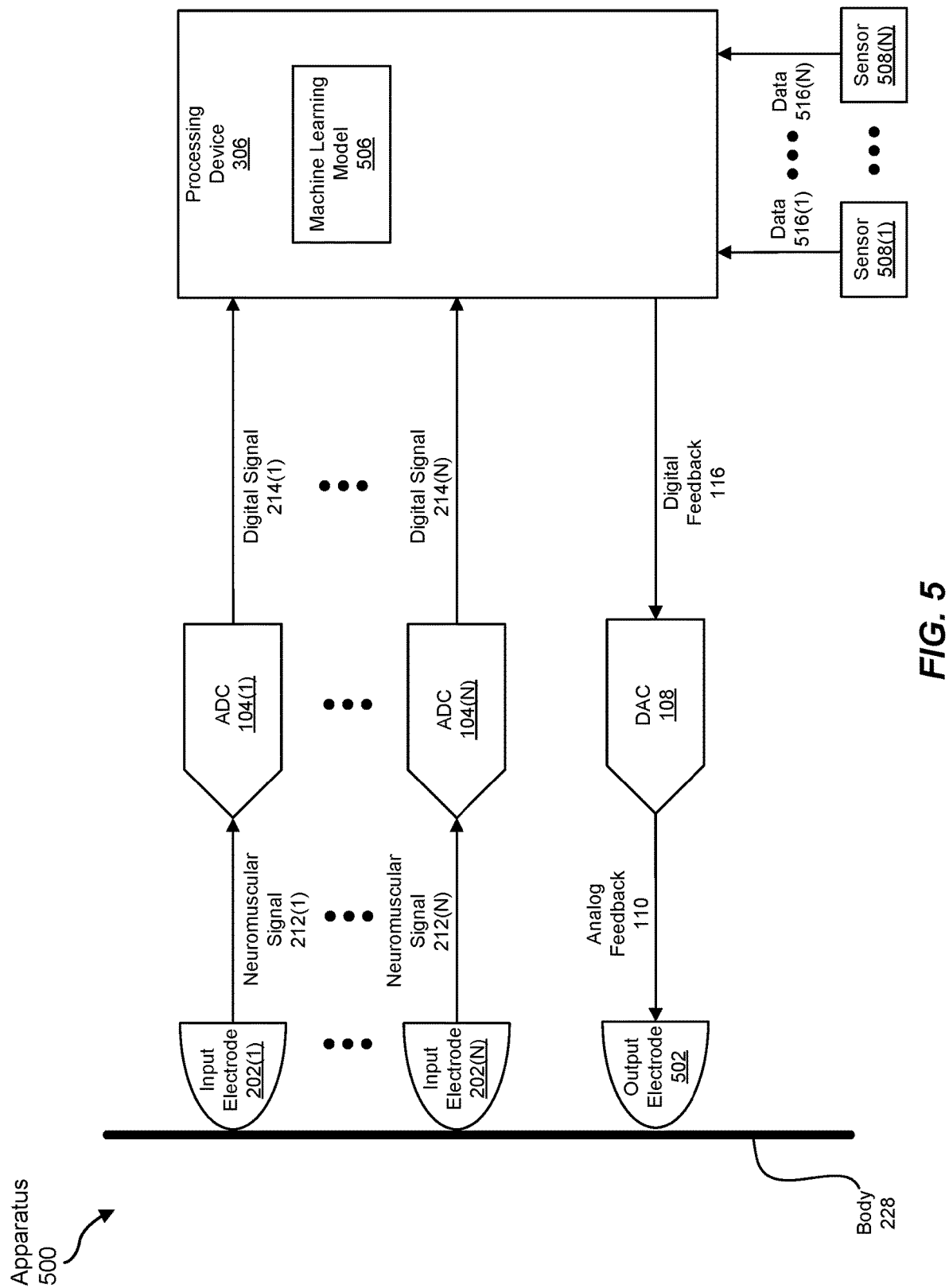
FIG. 5 is a block diagram of an exemplary apparatus for mitigating predictable interference in analog signals via destructive summation according to one or more embodiments of this disclosure.

FIG. 5 illustrates an exemplary apparatus 500 capable of mitigating predictable interference in analog signals via destructive summation. In some examples, apparatus 500 may include and/or represent certain devices, components, and/or features that perform and/or provide similar or identical functionalities as described above in connection with circuit 100 in FIG. 1, apparatus 200 in FIG. 2, apparatus 300 in FIG. 3, apparatus 400 in FIG. 4, and/or differential amplifier 700 in FIG. 7. As illustrated in FIG. 5, exemplary apparatus 500 may include and/or represent input electrodes 202(1)-(N) that sense, detect, and/or measure neuromuscular signals 212(1)-(N). In one example, apparatus 500 may also include and/or represent ADCs 104(1)-(N) communicatively coupled to input electrodes 202(1)-(N). In this example, ADCs 104(1)-(N) may convert and/or transform neuromuscular signals 212(1)-(N) into digital signals 214(1)-(N).

In some examples, apparatus 200 may further include and/or represent processing device 306 communicatively coupled to ADCs 104(1)-(N) and DAC 108. In such examples, processing device 306 may receive and/or obtain digital signals 214(1)-(N) from ADCs 104(1)-(N). In one example, processing device 306 may execute and/or implement a machine learning model 506 configured to combine and/or process digital signals 214(1)-(N) to predict, estimate, and/or forecast an amount of interference and/or noise expected to be present in neuromuscular signals 212(1)-(N) at a certain moment in time (whether present or future). In this example, machine learning model 506 may generate and/or produce digital feedback 116 as a representation of the amount of interference and/or noise expected to be present in neuromuscular signals 212(1)-(N) at that moment in time.

Examples of machine learning model 506 include, without limitation, convolutional neural networks, recurrent neural networks, supervised learning models, unsupervised learning models, linear regression models, logistic regression models, decision trees, support vector machine models, Naive Bayes models, k-nearest neighbor models, k-means models, random forest models, combinations or variations of one or more of the same, and/or any other suitable machine learning models or algorithms.

As a specific example, the machine learning model may represent a convolutional neural network that includes various layers, such as one or more convolution layers, activation layers, pooling layers, and fully connected layers. In this example, digital signals 214(1)-(N) may include and/or represent the most recent 100 milliseconds of digital data outputted by ADCs 104(1)-(N). Processing device 306 may pass digital signals 214(1)-(N) through the convolutional neural network to predict the appropriate digital feedback in view of digital signals 214(1)-(N).

In the convolutional neural network, digital signals 214(1)-(N) may first encounter the convolution layer. In one example, at the convolution layer, the 100 milliseconds of data in digital signals 214(1)-(N) may be convolved using a filter and/or kernel. In particular, the convolution layer may cause processing device 306 to slide a matrix function window over and/or across the 100 milliseconds of data in digital signals 214(1)-(N). Processing device 306 may then record the resulting data convolved by the filter and/or kernel. In one example, one or more nodes included in the filter and/or kernel may be weighted by a certain magnitude and/or value.

After completion of the convolution layer, the convolved representation of the digital signals 214(1)-(N) may encounter the activation layer. At the activation layer, the convolved data from digital signals 214(1)-(N) may be subjected to a non-linear activation function. In one example, the activation layer may cause processing device 306 to apply the non-linear activation function to the convolved data from digital signals 214(1)-(N). By doing so, processing device 306 may be able to identify and/or learn certain non-linear patterns, correlations, and/or relationships between different regions of the convolved data from digital signals 214(1)-(N).

In some examples, processing device 306 may apply one or more of these layers included in the convolutional neural network to digital signals 214(1)-(N) multiple times. As the data from digital signals 214(1)-(N) completes all the layers, the convolutional neural network may render a prediction, estimation, and/or extrapolation of the amount of interference and/or noise expected on neuromuscular signals 212(1)-(N) based at least in part on digital signals 214(1)-(N). In one example, machine learning module 506 and/or processing device 306 may generate and/or produce digital feedback 116 based at least in part on the prediction, estimation, and/or extrapolation of the amount of interference and/or noise. Accordingly, digital feedback 116 may represent and/or correspond to that amount of interference and/or noise.

In some examples, machine learning model 506 may factor in and/or take into account data received from one or more sensors when arriving at and/or making the prediction, estimation, and/or extrapolation of the amount of interference and/or noise expected on neuromuscular signals 212(1)-(N). For example, sensors 508(1)-(N) may be communicatively coupled to processing device 306. In this example, sensors 508(1)-(N) may generate and/or produce data 516(1)-(N) representative and/or indicative of one or more environmental observations, user actions, and/or user characteristics. Examples of sensors 508(1)-(N) include, without limitation, accelerometers, gyroscopes, magnetometers, inertial measurement units (IMUs), image processing devices, vision systems, vibration sensors, acoustic sensors, microphones, hydrophones, combinations or variations of one or more of the same, and/or any other suitable sensors.

In some examples, sensors 508(1)-(N) may transmit and/or provide data 516(1)-(N) to processing device 306 for processing in connection with digital signals 214(1)-(N). In one example, processing device 306 may pass data 516(1)-(N) to machine learning model 506 to facilitate processing data 516(1)-(N) along with digital signals 214(1)-(N). In other words, processing device 306 may apply data 516(1)-(N) and digital signals 214(1)-(N) to machine learning model 506 to predict, estimate, and/or extrapolate the amount of interference and/or noise expected on neuromuscular signals 212(1)-(N). In this example, machine learning model 506 may render a prediction, estimation, and/or extrapolation of the amount of inference and/or noise based at least in part on data 516(1)-(N) and digital signals 214(1)-(N). Processing device 306 may then generate and/or produce digital feedback 116 to reflect and/or represent that prediction, estimation, and/or extrapolation. Accordingly, digital feedback 116 may account for and/or be influenced by data 516(1)-(N).

In some examples, DAC 108 may convert digital feedback 116 to analog feedback 110. In such examples, DAC 108 may feed and/or provide analog feedback to an output electrode 502. In one example, output electrode 502 may inject, diffuse, feed, and/or provide analog feedback 110 to body 228 of the user. In this example, body 228 of the user may effectively serve and/or function to destructively sum neuromuscular signals 212(1)-(N) with analog feedback 110 and/or perform destructive interference on neuromuscular signals 212(1)-(N) with analog feedback 110.

Figure 6:
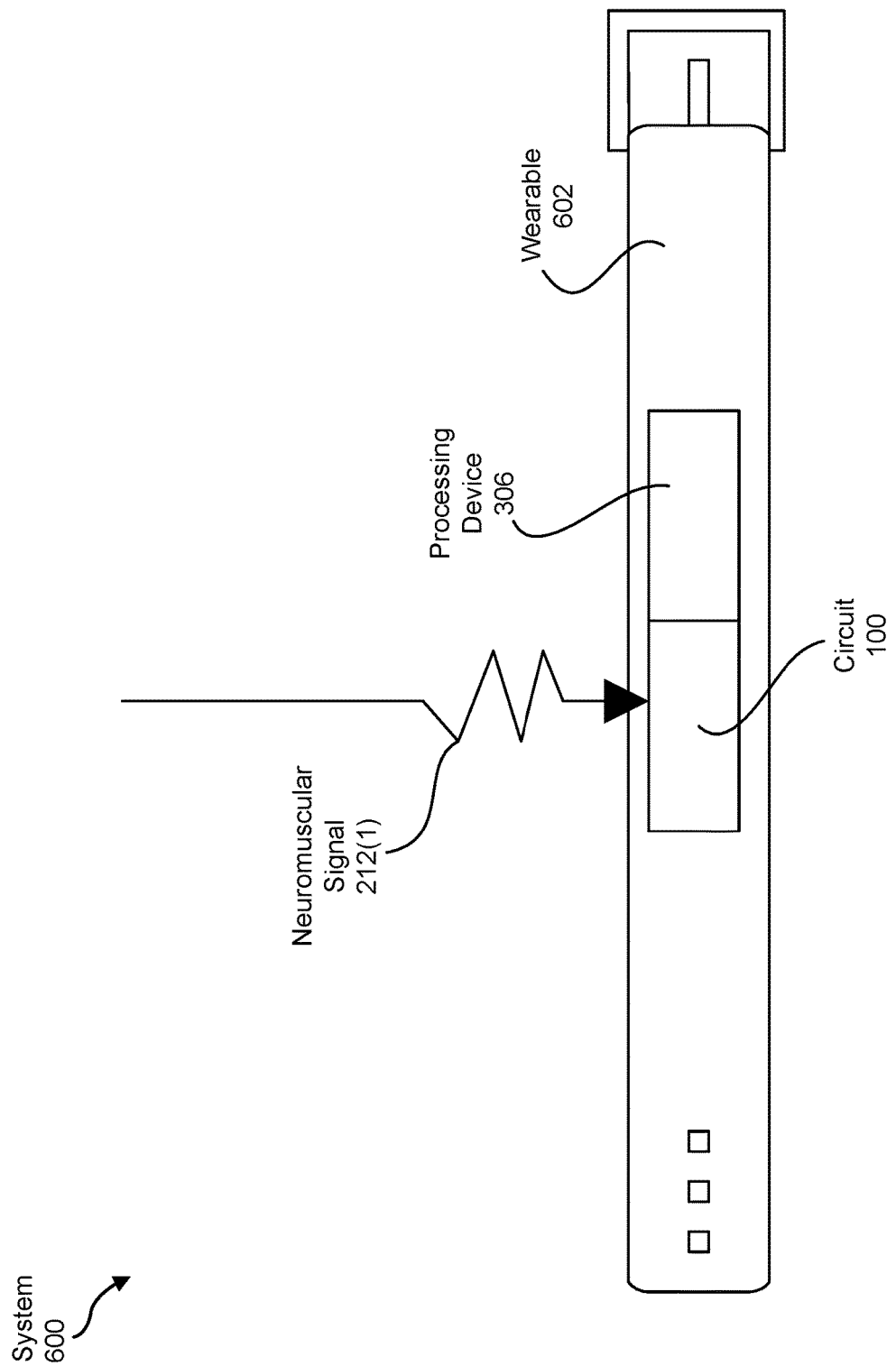
FIG. 6 is a block diagram of an exemplary system for mitigating predictable interference in analog signals via destructive summation according to one or more embodiments of this disclosure.

FIG. 6 illustrates an exemplary system 600 capable of mitigating predictable interference in analog signals via destructive summation. In some examples, system 600 may include and/or represent certain devices, components, and/or features that perform and/or provide similar or identical functionalities as described above in connection with circuit 100 in FIG. 1, apparatus 200 in FIG. 2, apparatus 300 in FIG. 3, apparatus 400 in FIG. 4, apparatus 500 in FIG. 5, and/or differential amplifier 700 in FIG. 7. As illustrated in FIG. 6, exemplary system 600 may include and/or represent circuit 100 coupled to a wearable 602. In one example, system 600 may include and/or represent a smartwatch equipped with at least a portion of circuit 100 and processing device 306. In this example, the portion of circuit 100 may be communicatively coupled to processing device 306 on a wristband.

In some examples, system 600 may include and/or represent a wearable communicatively coupled to another computing device, such as a head-mounted display (not necessarily illustrated in FIG. 6). In one example, processing device 306 incorporated into the wearable may generate and/or produce a command and/or an instruction based at least in part on a predictive signal of interest. In this example, the command and/or instruction may modify at least one feature of the head-mounted display to account for the predictive signal of interest. For example, a user donning the wearable and the head-mounted display may make a gesture with his or her arm or hand (e.g., an index-finger pinch, a middle-finger pinch, a ring-finger pinch, a pinky-finger pinch, a fist pose, and/or an open-hand pose). In this example, the gesture may cause EMG signals that traverse the user's body and are measured by circuit 100. Additionally or alternatively, circuit 100 and/or processing device 306 may generate and/or produce a predictive signal of interest based at least in part on the EMG signals and a predicted amount of interference and/or noise.

Continuing with this example, processing device 306 may generate and/or produce a command and/or an instruction based at least in part on the predictive signal of interest. Processing device 306 may transmit and/or send the command and/or instruction to the head-mounted display via a wireless connection. Upon receiving the command and/or instruction, the head-mounted display may execute the command and/or instruction to modify one or more features of an application. For example, the command and/or instruction may cause and/or direct the head-mounted display to modify, move, add, and/or remove a virtual component and/or element presented within the user's field of view to account for and/or respond to the gesture made by the user.

Figure 8:
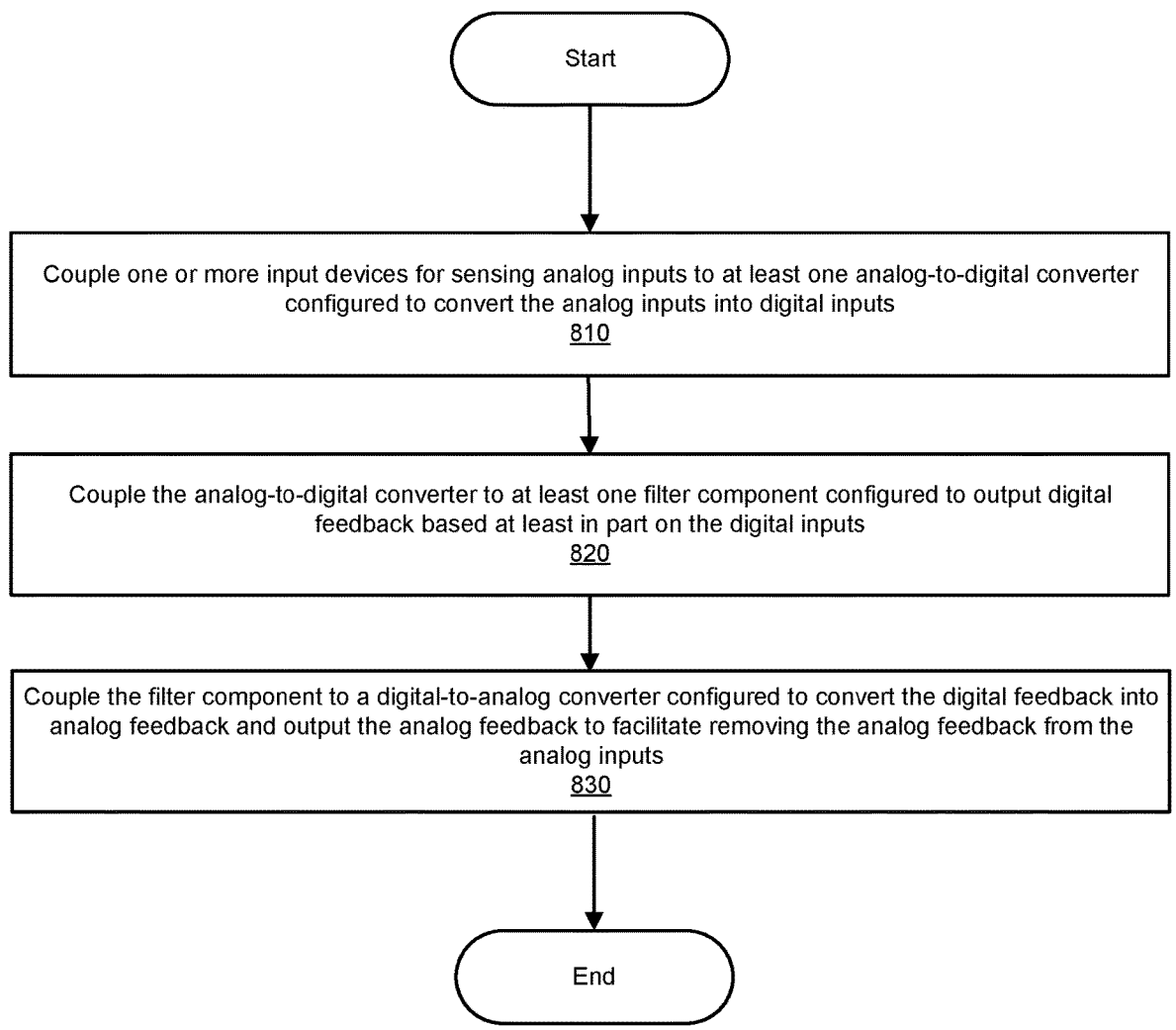
FIG. 8 is a flow diagram of an exemplary method for mitigating predictable interference in analog signals via destructive summation according to one or more embodiments of this disclosure.

FIG. 8 is a flow diagram of an exemplary method 800 for mitigating predictable interference in analog signals via destructive summation. In one example, the steps shown in FIG. 8 may be performed during the manufacture and/or assembly of a circuit, an apparatus, and/or a wearable device. Additionally or alternatively, the steps shown in FIG. 8 may also incorporate and/or involve various sub-steps and/or variations consistent with the descriptions provided above in connection with FIGS. 1-7.

As illustrated in FIG. 8, method 800 may include and/or involve the step of coupling one or more input devices for sensing analog inputs to at least one ADC configured to convert the analog inputs into digital inputs (810). Step 810 may be performed in a variety of ways, including any of those described above in connection with FIGS. 1-7. For example, a computing equipment manufacturer may couple and/or connect one or more input devices for sensing analog inputs to at least one ADC configured to convert the analog inputs into digital inputs.

In some examples, method 800 may also include and/or involve the step of coupling the analog-to-digital converter to at least one filter component configured to output a digital feedback based at least in part on the digital inputs (820). Step 820 may be performed in a variety of ways, including any of those described above in connection with FIGS. 1-7. For example, the computing equipment manufacturer may couple and/or connect the ADC to at least one filter component configured to output a digital feedback based at least in part on the digital inputs.

In some examples, method 800 may further include and/or involve the step of coupling the filter component to a digital-to-analog converter configured to convert the digital feedback into an analog feedback and output the analog feedback to facilitate removing the analog feedback from the analog inputs (830). Step 830 may be performed in a variety of ways, including any of those described above in connection with FIGS. 1-7. For example, the computing equipment manufacturer may couple and/or connect the filter component to a digital-to-analog converter configured to convert the digital feedback into an analog feedback and output the analog feedback to facilitate removing the analog feedback from the analog inputs.

EXAMPLE EMBODIMENTS

Example 1: A circuit comprising (1) one or more input devices configured to sense analog inputs, (2) at least one analog-to-digital converter communicatively coupled to the input devices and configured to convert the analog inputs into digital inputs, (3) at least one filter component communicatively coupled to the analog-to-digital converter and configured to output digital feedback based at least in part on the digital inputs, and (4) a digital-to-analog converter communicatively coupled to the filter component and configured to (A) convert the digital feedback into analog feedback and (B) output the analog feedback to facilitate removing the analog feedback from the analog inputs.

Example 2: The circuit of Example 1, wherein the input devices comprise one or more input electrodes configured to communicatively couple the analog-to-digital converter to a body of a user and further comprising an output electrode configured to communicatively couple the digital-to-analog converter to the body of the user.

Example 3: The circuit of Example 1 or 2, wherein the output electrode is configured to feed the analog feedback to the body of the user such that the analog feedback is destructively summed with the analog inputs via the body of the user.

Example 4: The circuit of any of Examples 1-3, further comprising one or more differential amplifiers communicatively coupled between the input devices and the analog-to-digital converter, wherein the differential amplifiers (1) each comprise an input configured to receive one of the analog inputs and another input configured to receive the analog feedback and (2) are each configured to destructively sum the analog feedback with the analog inputs prior to the analog inputs being converted into the digital inputs.

Example 5: The circuit of any of Examples 1-4, wherein the analog-to-digital converter comprises one or more differential analog-to-digital converters with positive inputs configured to receive the analog inputs and negative inputs configured to receive the analog feedback, wherein the differential analog-to-digital converters are configured to destructively sum the analog feedback with the analog inputs prior to the analog inputs being converted into the digital inputs.

Example 6: The circuit of any of Examples 1-5, wherein the filter component comprises a filterbank configured to combine the digital inputs to produce the digital feedback.

Example 7: The circuit of any of Examples 1-6, further comprising at least one processing device communicatively coupled to the analog-to-digital converter and the digital-to-analog converter, and wherein the filter component comprises a machine learning model configured to (1) run on the processing device and (2) combine the digital inputs to produce the digital feedback.

Example 8: The circuit of any of Examples 1-7, further comprising at least one sensor communicatively coupled to the processing device, and wherein the processing device is configured to (1) receive data from the sensor and (2) provide the data to the machine learning model to enable the machine learning model to account for the data in the digital feedback.

Example 9: The circuit of any of Examples 1-8, wherein the sensor comprises at least one of an accelerometer, a gyroscope, a magnetometer, an inertial measurement unit, an image processing device, a vibration sensor, and an acoustic sensor.

Example 10: The circuit of any of Examples 1-9, further comprising at least one processing device communicatively coupled to the analog-to-digital converter and the digital-to-analog converter, wherein (1) the analog-to-digital converter feeds the digital inputs to the processing device, (2) the filter component provides the digital feedback to the processing device, and (3) the processing device isolates a predictive signal of interest by processing the digital inputs and the digital feedback.

Example 11: The circuit of any of Examples 1-10, wherein the processing device generates, based at least in part on the predictive signal of interest, a command that causes a computing device to modify at least one feature to account for the predictive signal of interest.

Example 12: The circuit of any of Examples 1-11, wherein the digital feedback constitutes a predictive representation of an amount of interference expected to exist in the analog inputs.

Example 13: The circuit of any of Examples 1-12, wherein the analog feedback facilitates subtracting the predicted representation of the amount of interference from the analog inputs in an analog domain.

Example 14: The circuit of any of Examples 1-13, wherein the analog inputs comprise at least one of (1) neuromuscular signals sensed via a body of a user, (2) EMG signals sensed via a body of a user, (3) ECG signals sensed via a body of a user, (4) MMG signals sensed via a body of a user, or (5) SMG signals sensed via a body of a user.

Example 15: A system comprising (1) a computing device, and (2) a circuit communicatively coupled to the computing device, wherein the circuit comprises (A) one or more input devices configured to sense analog inputs, (B) at least one analog-to-digital converter communicatively coupled to the input devices and configured to convert the analog inputs into digital inputs, (C) at least one filter component communicatively coupled to the analog-to-digital converter and configured to output a digital feedback based at least in part on the digital inputs, and (D) a digital-to-analog converter communicatively coupled to the filter component and configured to (I) convert the digital feedback into analog feedback and (II) output the analog feedback to facilitate removing the analog feedback from the analog inputs.

Example 16: The system of Example 15, wherein the input devices comprise one or more input electrodes configured to communicatively couple the analog-to-digital converter to a body of a user and further comprising an output electrode configured to communicatively couple the digital-to-analog converter to the body of the user.

Example 17: The system of Example 15 or 16, further comprising at least one processing device communicatively coupled to the analog-to-digital converter and the digital-to-analog converter, wherein (1) the analog-to-digital converter feeds the digital inputs to the processing device, (2) the filter component provides the digital feedback to the processing device, and (3) the processing device isolates a predictive signal of interest by processing the digital inputs and the digital feedback.

Example 18: The system of any of Examples 15-17, wherein the processing device generates, based at least in part on the predictive signal of interest, a command that causes a computing device to modify at least one feature to account for the predictive signal of interest.

Example 19: The system of any of Examples 15-18, wherein the computing device comprises a head-mounted display dimensioned to be worn by a user of an artificial-reality system.

Example 20: A method comprising (1) coupling one or more input devices for sensing analog inputs to at least one analog-to-digital converter configured to convert the analog inputs into digital inputs, (2) coupling the analog-to-digital converter to at least one filter component configured to output a digital feedback based at least in part on the digital inputs, and (3) coupling the filter component to a digital-to-analog converter configured to convert the digital feedback into an analog feedback and output the analog feedback to facilitate removing the analog feedback from the analog inputs.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive electrical energy, transform the electrical energy to light energy, and then transform the light energy back into electrical energy. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 900 in FIG. 9) or that visually immerses a user in an artificial reality (such as, e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
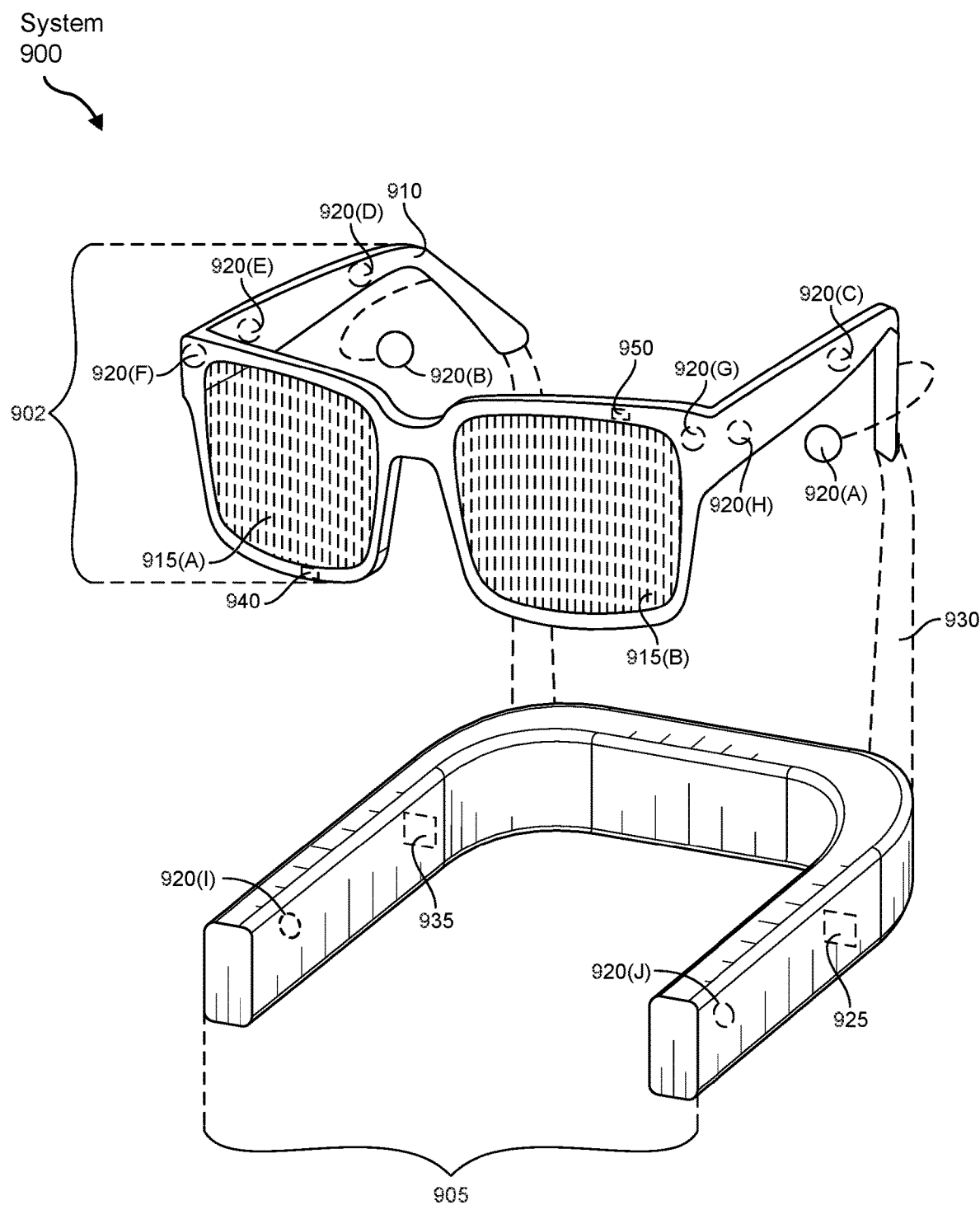
FIG. 9 is an illustration of exemplary augmented-reality glasses that may be used in connection with embodiments of this disclosure.

Turning to FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented-reality system 900 may include one or more sensors, such as sensor 940. Sensor 940 may generate measurement signals in response to motion of augmented-reality system 900 and may be located on substantially any portion of frame 910. Sensor 940 may represent one or more of a variety of different sensing mechanisms, such as a position sensor, an inertial measurement unit (IMU), a depth camera assembly, a structured light emitter and/or detector, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

In some examples, augmented-reality system 900 may also include a microphone array with a plurality of acoustic transducers 920(A)-920(J), referred to collectively as acoustic transducers 920. Acoustic transducers 920 may represent transducers that detect air pressure variations induced by sound waves. Each acoustic transducer 920 may be configured to detect sound and convert the detected sound into an electronic format (e.g., an analog or digital format). The microphone array in FIG. 9 may include, for example, ten acoustic transducers: 920(A) and 920(B), which may be designed to be placed inside a corresponding ear of the user, acoustic transducers 920(C), 920(D), 920(E), 920(F), 920(G), and 920(H), which may be positioned at various locations on frame 910, and/or acoustic transducers 920(I) and 920(J), which may be positioned on a corresponding neckband 905.

In some embodiments, one or more of acoustic transducers 920(A)-(J) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer 920, or some combination thereof.

Acoustic transducers 920(A) and 920(B) may be positioned on different parts of the user's ear, such as behind the pinna, behind the tragus, and/or within the auricle or fossa. Or, there may be additional acoustic transducers 920 on or surrounding the ear in addition to acoustic transducers 920 inside the ear canal. Having an acoustic transducer 920 positioned next to an ear canal of a user may enable the microphone array to collect information on how sounds arrive at the ear canal. By positioning at least two of acoustic transducers 920 on either side of a user's head (e.g., as binaural microphones), augmented-reality system 900 may simulate binaural hearing and capture a 3D stereo sound field around about a user's head. In some embodiments, acoustic transducers 920(A) and 920(B) may be connected to augmented-reality system 900 via a wired connection 930, and in other embodiments acoustic transducers 920(A) and 920(B) may be connected to augmented-reality system 900 via a wireless connection (e.g., a BLUETOOTH connection). In still other embodiments, acoustic transducers 920(A) and 920(B) may not be used at all in conjunction with augmented-reality system 900.

Acoustic transducers 920 on frame 910 may be positioned in a variety of different ways, including along the length of the temples, across the bridge, above or below display devices 915(A) and 915(B), or some combination thereof. Acoustic transducers 920 may also be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers, other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(I) and 920(J)) that are part of the microphone array (or potentially form their own microphone subarray). Neckband 905 may also include a controller 925 and a power source 935.

Acoustic transducers 920(I) and 920(J) of neckband 905 may be configured to detect sound and convert the detected sound into an electronic format (analog or digital). In the embodiment of FIG. 9, acoustic transducers 920(I) and 920(J) may be positioned on neckband 905, thereby increasing the distance between the neckband acoustic transducers 920(I) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920 (D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on neckband 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002 and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 900 and/or virtual-reality system 1000 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 900 and/or virtual-reality system 1000 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 900 and/or virtual-reality system 1000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, systems 900 and 1000 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 11:
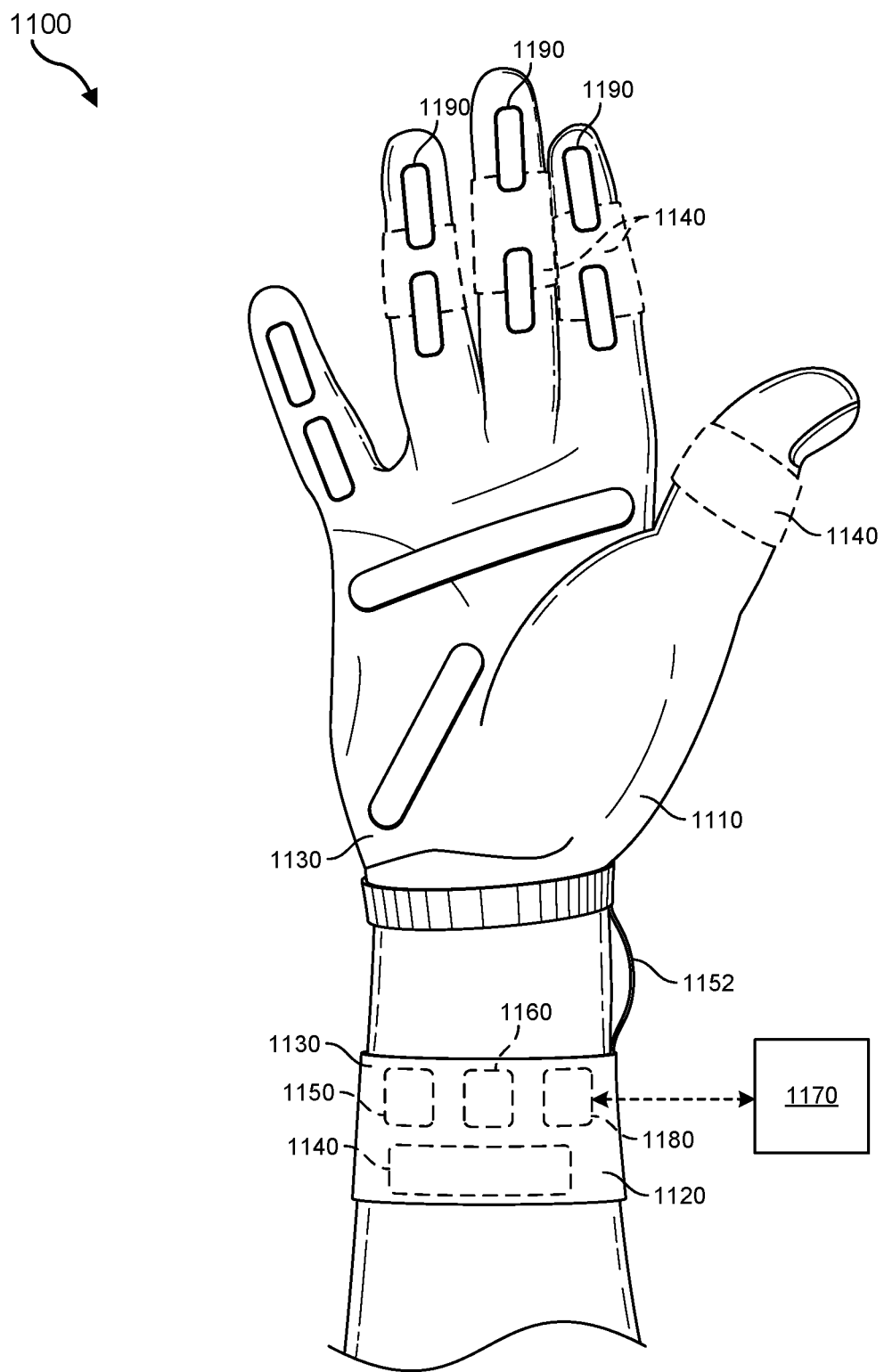
FIG. 11 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). Haptic device 1110 and haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1140 may be positioned at least partially within one or more corresponding pockets formed in textile material 1130 of vibrotactile system 1100. Vibrotactile devices 1140 may be positioned in locations to provide a vibrating sensation (e.g., haptic feedback) to a user of vibrotactile system 1100. For example, vibrotactile devices 1140 may be positioned against the user's finger(s), thumb, or wrist, as shown in FIG. 11. Vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to vibrotactile devices 1140, such as via conductive wiring 1152. In some examples, each of vibrotactile devices 1140 may be independently electrically coupled to power source 1150 for individual activation. In some embodiments, a processor 1160 may be operatively coupled to power source 1150 and configured (e.g., programmed) to control activation of vibrotactile devices 1140.

Vibrotactile system 1100 may be implemented in a variety of ways. In some examples, vibrotactile system 1100 may be a standalone system with integral subsystems and components for operation independent of other devices and systems. As another example, vibrotactile system 1100 may be configured for interaction with another device or system 1170. For example, vibrotactile system 1100 may, in some examples, include a communications interface 1180 for receiving and/or sending signals to the other device or system 1170. The other device or system 1170 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1180 may enable communications between vibrotactile system 1100 and the other device or system 1170 via a wireless (e.g., Wi-Fi, BLUETOOTH, cellular, radio, etc.) link or a wired link. If present, communications interface 1180 may be in communication with processor 1160, such as to provide a signal to processor 1160 to activate or deactivate one or more of the vibrotactile devices 1140.

Vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although power source 1150, processor 1160, and communications interface 1180 are illustrated in FIG. 11 as being positioned in haptic device 1120, the present disclosure is not so limited. For example, one or more of power source 1150, processor 1160, or communications interface 1180 may be positioned within haptic device 1110 or within another wearable textile.

Figure 12:
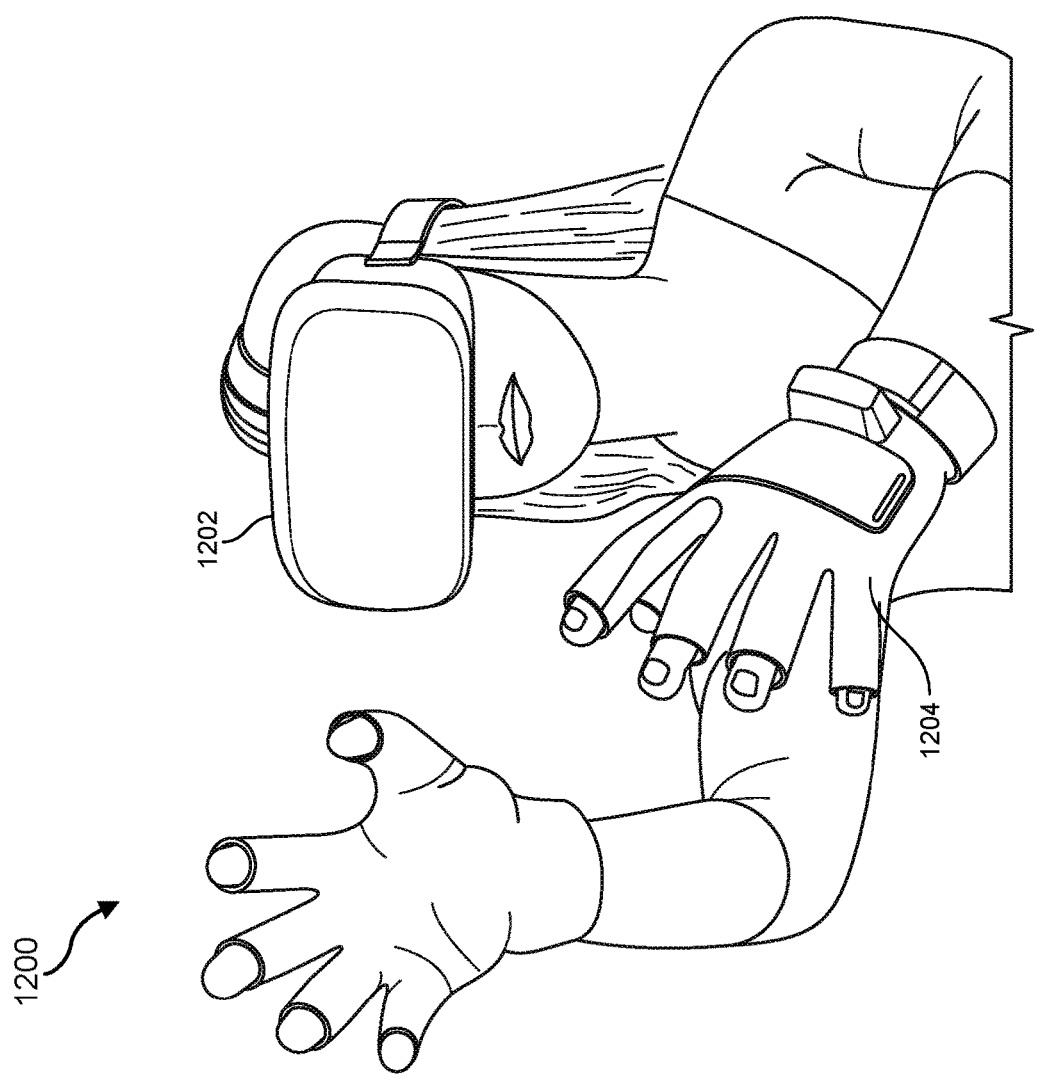
FIG. 12 is an illustration of an exemplary virtual-reality environment according to embodiments of this disclosure.

Haptic wearables, such as those shown in and described in connection with FIG. 11, may be implemented in a variety of types of artificial-reality systems and environments. FIG. 12 shows an example artificial-reality environment 1200 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 10:
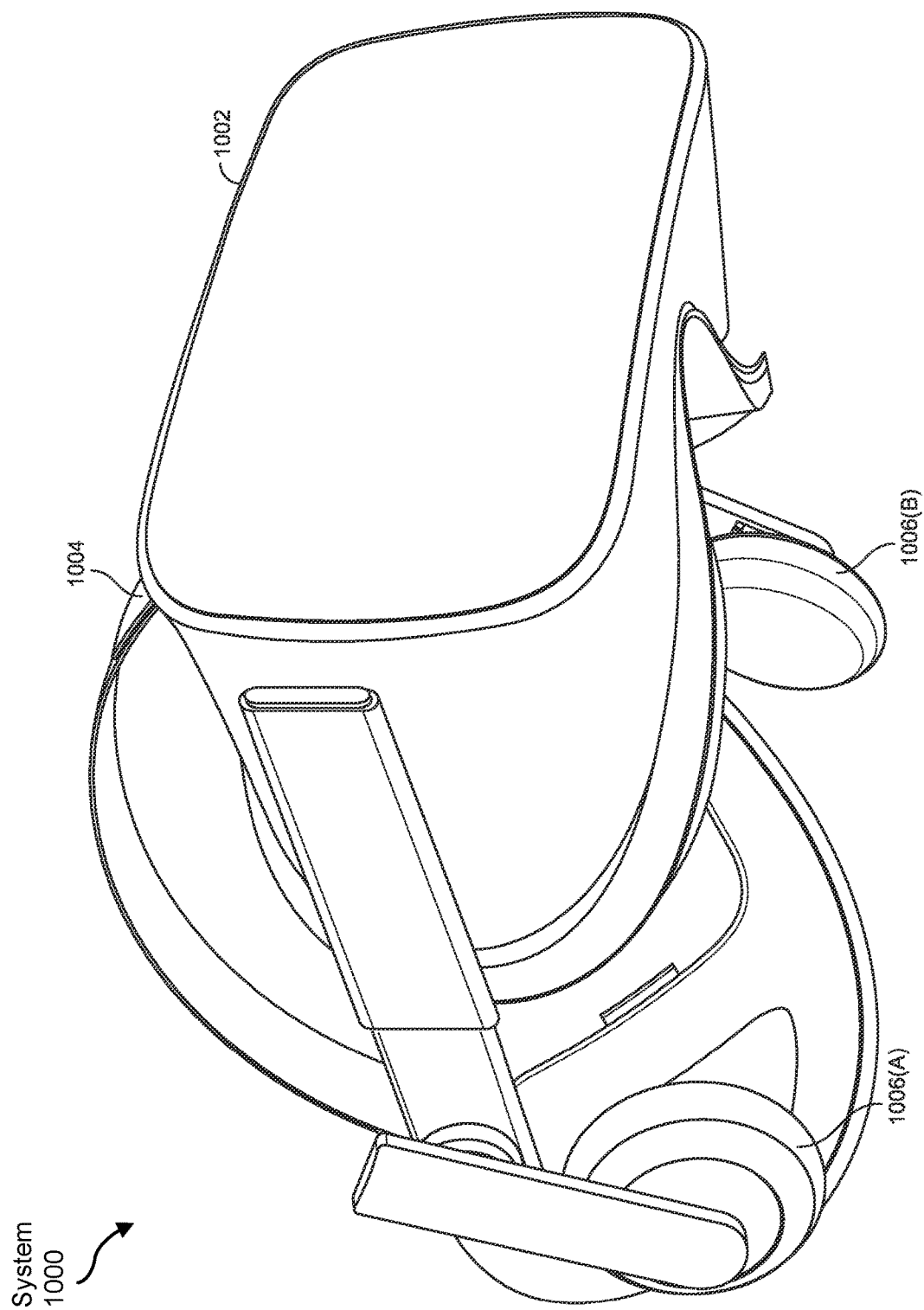
FIG. 10 is an illustration of an exemplary virtual-reality headset that may be used in connection with embodiments of this disclosure.

Head-mounted display 1202 generally represents any type or form of virtual-reality system, such as virtual-reality system 1000 in FIG. 10. Haptic device 1204 generally represents any type or form of wearable device, worn by a user of an artificial-reality system, that provides haptic feedback to the user to give the user the perception that he or she is physically engaging with a virtual object. In some embodiments, haptic device 1204 may provide haptic feedback by applying vibration, motion, and/or force to the user. For example, haptic device 1204 may limit or augment a user's movement. To give a specific example, haptic device 1204 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1204 to send action requests to a console. Examples of action requests include, without limitation, requests to start an application and/or end the application and/or requests to perform a particular action within the application.

Figure 13:
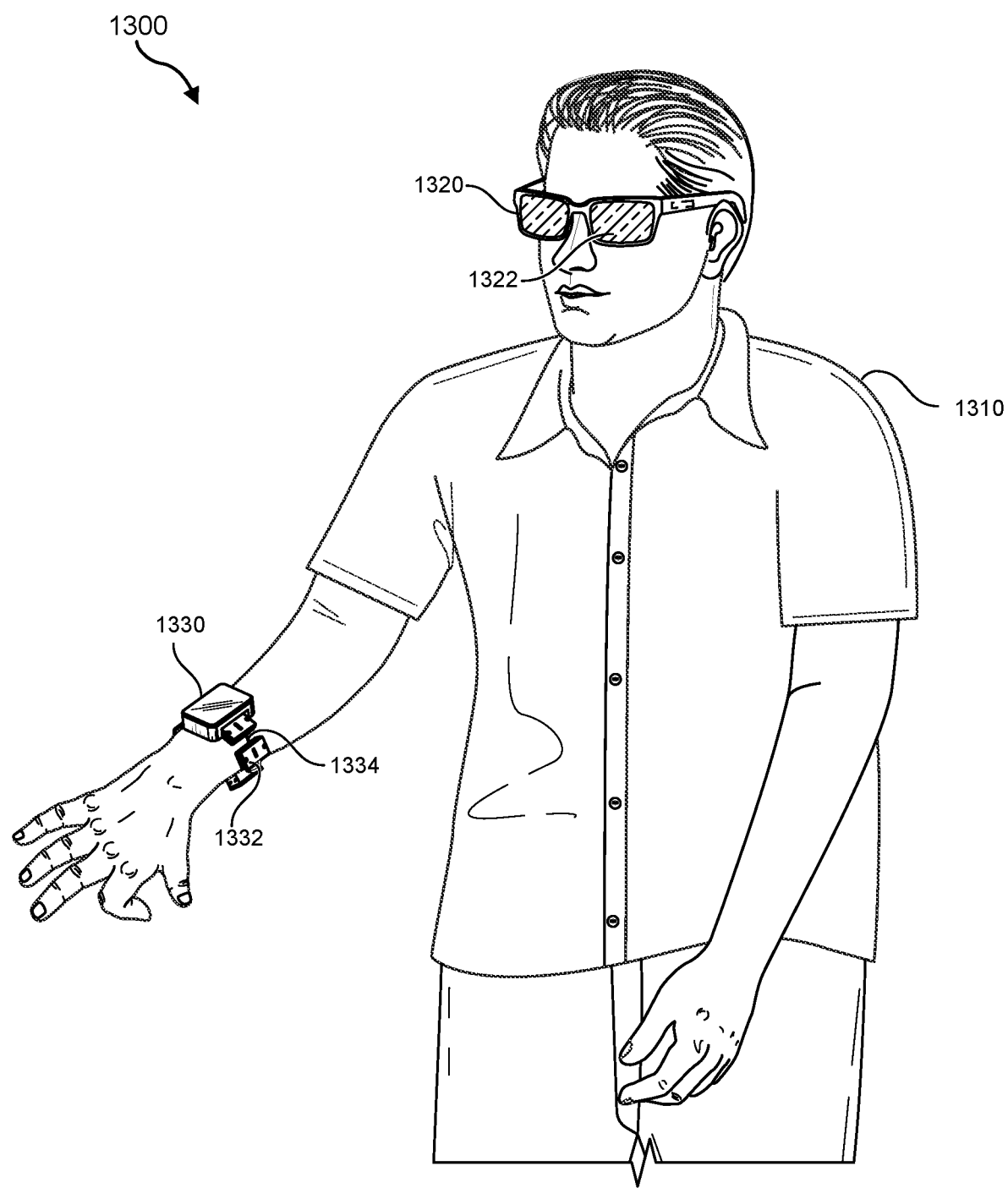
FIG. 13 is an illustration of an exemplary augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view of a user 1310 interacting with an augmented-reality system 1300. In this example, user 1310 may wear a pair of augmented-reality glasses 1320 that may have one or more displays 1322 and that are paired with a haptic device 1330. In this example, haptic device 1330 may be a wristband that includes a plurality of band elements 1332 and a tensioning mechanism 1334 that connects band elements 1332 to one another.

One or more of band elements 1332 may include any type or form of actuator suitable for providing haptic feedback. For example, one or more of band elements 1332 may be configured to provide one or more of various types of cutaneous feedback, including vibration, force, traction, texture, and/or temperature. To provide such feedback, band elements 1332 may include one or more of various types of actuators. In one example, each of band elements 1332 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1110, 1120, 1204, and 1330 may include any suitable number and/or type of haptic transducer, sensor, and/or feedback mechanism. For example, haptic devices 1110, 1120, 1204, and 1330 may include one or more mechanical transducers, piezoelectric transducers, and/or fluidic transducers. Haptic devices 1110, 1120, 1204, and 1330 may also include various combinations of different types and forms of transducers that work together or independently to enhance a user's artificial-reality experience. In one example, each of band elements 1332 of haptic device 1330 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to any claims appended hereto and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Finally, for ease of use, the terms "including" and "having" (and their derivatives), as used in the specification and/or claims, are interchangeable with and have the same meaning as the word "comprising."

What is claimed is:

1. A wearable device comprising:
   first and second biosensors configured to sense respective first and second analog neuromuscular signals from a body of a user;
   a first analog-to-digital converter (ADC) communicatively coupled to the first biosensor and configured to convert the first analog neuromuscular signal into a first digital neuromuscular signal;
   a second ADC communicatively coupled to the second biosensor and configured to convert the second analog neuromuscular signal into a second digital neuromuscular signal;
   at least one filter component communicatively coupled to the first and second ADCs and configured to output digital feedback based at least in part on the first and second digital neuromuscular signals; and
   a digital-to-analog converter (DAC) communicatively coupled to the filter component and configured to:
   convert the digital feedback into analog feedback; and
   output the analog feedback to facilitate removing the analog feedback from the first and second analog neuromuscular signals;
   wherein after the analog feedback is removed from the first and second analog neuromuscular signals, the first and second digital neuromuscular signals are used to determine one or more gestures performed by the user for causing one or more actions at an external device based on the one or more gestures.

2. The wearable device of claim 1, wherein:
   the first and second biosensors comprise one or more input electrodes configured to communicatively couple the first and second ADCs to the body of the user; and
   further comprising an output electrode configured to communicatively couple the DAC to the body of the user.

3. The wearable device of claim 2, wherein the output electrode is configured to feed the analog feedback to the body of the user such that the analog feedback is destructively summed with the first and second analog neuromuscular signals via the body of the user.

4. The wearable device of claim 1, further comprising one or more differential amplifiers communicatively coupled between the first and second biosensors and the first and second ADCs, wherein the differential amplifiers:

each comprise an input configured to receive one of the first and second analog neuromuscular signals and another input configured to receive the analog feedback; and are each configured to destructively sum the analog feedback with the first or second analog neuromuscular signals prior to the first or second analog neuromuscular signals being converted into the first or second digital neuromuscular signals.

5. The wearable device of claim 4, wherein the first and second ADCs each comprise one or more differential ADCs with positive inputs configured to receive the first or second analog neuromuscular signals and negative inputs configured to receive the analog feedback, wherein the differential ADCs are configured to destructively sum the analog feedback with the first or second analog neuromuscular signals prior to the first or second analog neuromuscular signals being converted into the first or second digital neuromuscular signals.

6. The wearable device of claim 1, wherein the filter component comprises a filterbank configured to combine the first and second digital neuromuscular signals to produce the digital feedback.

7. The wearable device of claim 1, further comprising at least one processing device communicatively coupled to the first and second ADCs and the DAC; and wherein the filter component comprises a machine learning model configured to:
run on the processing device; and
combine the first and second digital neuromuscular signals to produce the digital feedback.

8. The wearable device of claim 7, further comprising at least one sensor communicatively coupled to the processing device; and wherein the processing device is configured to:
receive data from the sensor; and
provide the data to the machine learning model to enable the machine learning model to account for the data in the digital feedback.

9. The wearable device of claim 8, wherein the sensor comprises at least one of:
an accelerometer;
a gyroscope;
a magnetometer;
an inertial measurement unit;
an image processing device;
a vibration sensor; or
an acoustic sensor.

10. The wearable device of claim 1, further comprising at least one processing device communicatively coupled to the first and second ADCs and the DAC, wherein:
the first and second ADCs feed the first and second digital neuromuscular signals to the processing device;
the filter component provides the digital feedback to the processing device; and
the processing device isolates a predictive signal of interest by processing the first and second digital neuromuscular signals and the digital feedback.

11. The wearable device of claim 10, wherein the processing device generates, based at least in part on the predictive signal of interest, a command that causes a computing device to modify at least one feature to account for the predictive signal of interest.

12. The wearable device of claim 1, wherein the digital feedback constitutes a predictive representation of an amount of interference expected to exist in the first and second analog neuromuscular signals.

13. The wearable device of claim 12, wherein the analog feedback facilitates subtracting the predictive representation of the amount of interference from the first and second analog neuromuscular signals in an analog domain.

14. A system comprising:
a computing device; and
a circuit communicatively coupled to the computing device, wherein the circuit comprises:
first and second biosensors configured to sense respective first and second analog neuromuscular signals from a body of a user;
a first ADC communicatively coupled to the first biosensor and configured to convert the first analog neuromuscular signal into a first digital neuromuscular signal;
a second ADC communicatively coupled to the second biosensor and configured to convert the second analog neuromuscular signal into a second digital neuromuscular signal;
at least one filter component communicatively coupled to the first and second ADCs and configured to output digital feedback based at least in part on the first and second digital neuromuscular signals; and
a DAC communicatively coupled to the filter component and configured to:
convert the digital feedback into analog feedback; and
output the analog feedback to facilitate removing the analog feedback from the first and second analog neuromuscular signals;
wherein after the analog feedback is removed from the first and second analog neuromuscular signals, the first and second digital neuromuscular signals are used to determine one or more gestures performed by the user for causing one or more actions at an external device based on the one or more gestures.

15. The system of claim 14, wherein the first and second biosensors comprise one or more input electrodes configured to communicatively couple the first and second ADCs to the body of the user; and further comprising an output electrode configured to communicatively couple the DAC to the body of the user.

16. The system of claim 14, further comprising at least one processing device communicatively coupled to the first and second ADCs and the DAC, wherein:
the first and second ADCs feed the first and second digital neuromuscular signals to the processing device;
the filter component provides the digital feedback to the processing device; and
the processing device isolates a predictive signal of interest by processing the first and second digital neuromuscular signals and the digital feedback.

17. The system of claim 16, wherein the processing device generates, based at least in part on the predictive signal of interest, a command that causes a computing device to modify at least one feature to account for the predictive signal of interest.

18. The system of claim 17, wherein the computing device comprises a head-mounted display dimensioned to be worn by a user of an artificial-reality system.

19. A method comprising:
coupling first and second biosensors for sensing respective first and second analog neuromuscular signals to respective first and second ADCs, wherein the first ADC is configured to convert the first analog neuromuscular signal into a first digital neuromuscular signal, and the second ADC is configured to convert the second analogy neuromuscular signal into a second digital neuromuscular signal;

coupling the first and second ADCs to at least one filter component configured to output digital feedback based at least in part on the first and second digital neuromuscular signals; and coupling the filter component to a DAC configured to convert the digital feedback into analog feedback and output the analog feedback to facilitate removing the analog feedback from the first and second analog neuromuscular signals.

\* \* \* \* \*